United States Patent
Tsuihiji et al.

(10) Patent No.: US 6,461,524 B1
(45) Date of Patent: Oct. 8, 2002

(54) METHOD OF FILTERING A FLUID

(75) Inventors: Motoyuki Tsuihiji; Hirofumi Iinuma, both of Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 09/537,316

(22) Filed: Mar. 29, 2000

(30) Foreign Application Priority Data

| | | |
|---|---|---|
| May 27, 1999 | (JP) | 11-148351 |
| May 27, 1999 | (JP) | 11-148352 |
| May 27, 1999 | (JP) | 11-148353 |
| Dec. 14, 1999 | (JP) | 11-353822 |

(51) Int. Cl.$^7$ .............................................. B01D 37/02
(52) U.S. Cl. ........................ 210/777; 451/60; 210/745; 210/778; 210/785; 210/791
(58) Field of Search .............................. 210/85, 86, 94, 210/143, 193, 257.1, 258, 406, 416.1, 490, 500.36, 739, 745–748, 777, 778, 785, 791, 797, 798, 194, 407–410, 805; 451/60, 87, 88

(56) References Cited

U.S. PATENT DOCUMENTS

| | | | | |
|---|---|---|---|---|
| 2,971,648 A | * | 2/1961 | Lane et al. ................... | 210/778 |
| 3,259,571 A | * | 7/1966 | Marshall et al. ............. | 210/778 |
| 3,618,766 A | * | 11/1971 | Morey ......................... | 210/778 |
| 3,679,052 A | | 7/1972 | Asper .......................... | 210/193 |
| 3,735,872 A | | 5/1973 | Anderson .................... | 210/193 |
| 5,013,461 A | * | 5/1991 | Drori ........................... | 210/777 |
| 5,062,968 A | | 11/1991 | Warning ...................... | 210/778 |
| 5,591,329 A | * | 1/1997 | Davidson ..................... | 210/193 |
| 5,664,990 A | * | 9/1997 | Adams et al. ................ | 451/60 |
| 5,772,867 A | * | 6/1998 | Chiang et al. ............... | 210/778 |
| 5,910,250 A | * | 6/1999 | Hahendran et al. .......... | 210/636 |
| 6,033,566 A | | 3/2000 | Averill et al. ................ | 210/777 |
| 6,077,437 A | * | 6/2000 | Hayashi et al. ............... | 451/88 |
| 6,165,048 A | * | 12/2000 | Russ et al. ................... | 210/193 |

FOREIGN PATENT DOCUMENTS

| | | |
|---|---|---|
| DE | 19534102 A1 | 3/1997 |
| EP | 0639534 A2 | 8/1994 |
| WO | WO98/05402 | 2/1998 |

OTHER PUBLICATIONS

Modeling of Fouling Reduction by Secondary Membranes; Journal of Membrane Science 168 (2000) 243–258.
Translated Abstract of Japan Publication 01022391, Published Jan. 1989.
Industrial Materials (vol. 47, No. 7) p. 55–59: issued on Jul. 1, 1999 Wastewater treatment by using a fine filtration hollow sting film.
Industrial Materials (vol. 47, No. 7) p. 60–63: issued on Jul. 1, 1999 Wastewater treatment by using a fine filtration hollow sting film.
Electronics Materials (vol. 38, No. 9) p. 1–4: issued on Sep. 1, 1999 Development for wastewater treatment technology for semiconductor mounting steps.

* cited by examiner

Primary Examiner—Joseph W. Drodge
(74) Attorney, Agent, or Firm—Fish & Richardson P.C.

(57) ABSTRACT

A fluid is filtered by first preparing a filter which includes a base filter and solid substances provided on the base filter, such that the solid substances differ from objects within the fluid to be filtered that are removed by the filter. The objects of filtration are filtered by supplying the fluid to the filter. During filtration, a force is applied to the filter to move the solid substances and objects deposited on the filter. The application of such force thus allows continuous filtration through the filter. The force can take the form of application of rising bubbles, a mechanical vibration or sonic waves to the filter. The filtration method is useful in processing fluid waste from mechanical processes, such as CMP steps.

48 Claims, 20 Drawing Sheets

75 : FIRST RESERVOIR TANK
35 : FILTRATION UNIT

75 : FIRST TANK
35 : FILTRATION UNIT

75 : FIRST TANK
35 : FILTRATION UNIT

FIG. 7A
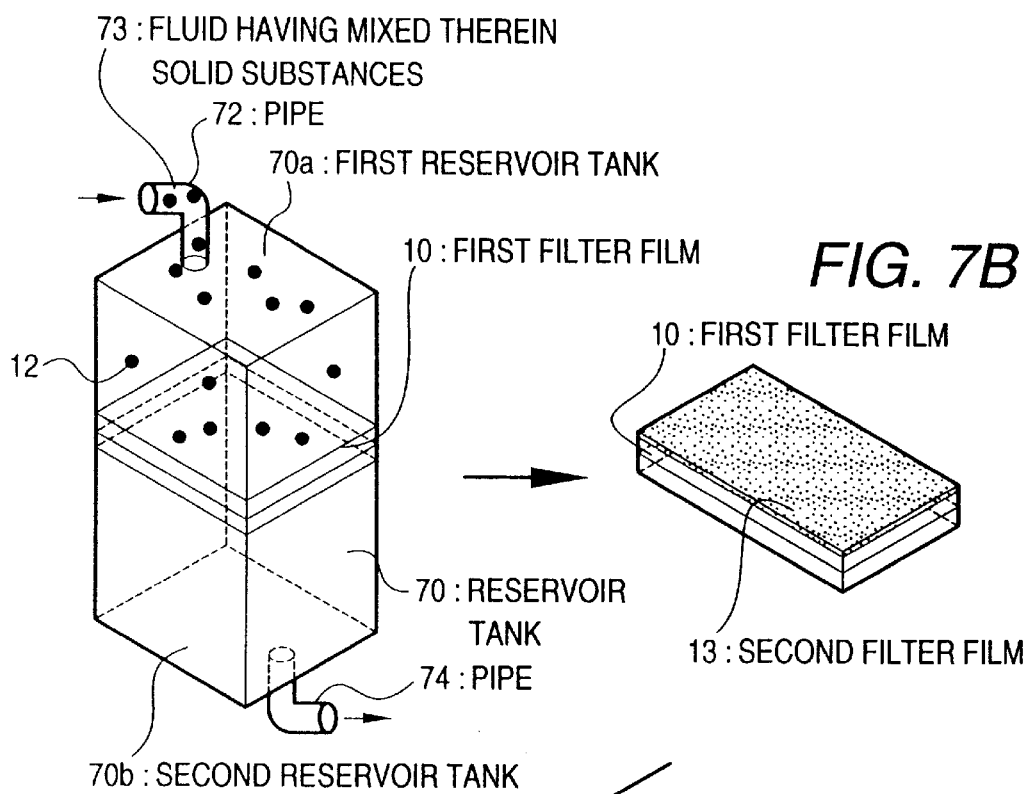
FIG. 7B
FIG. 7C
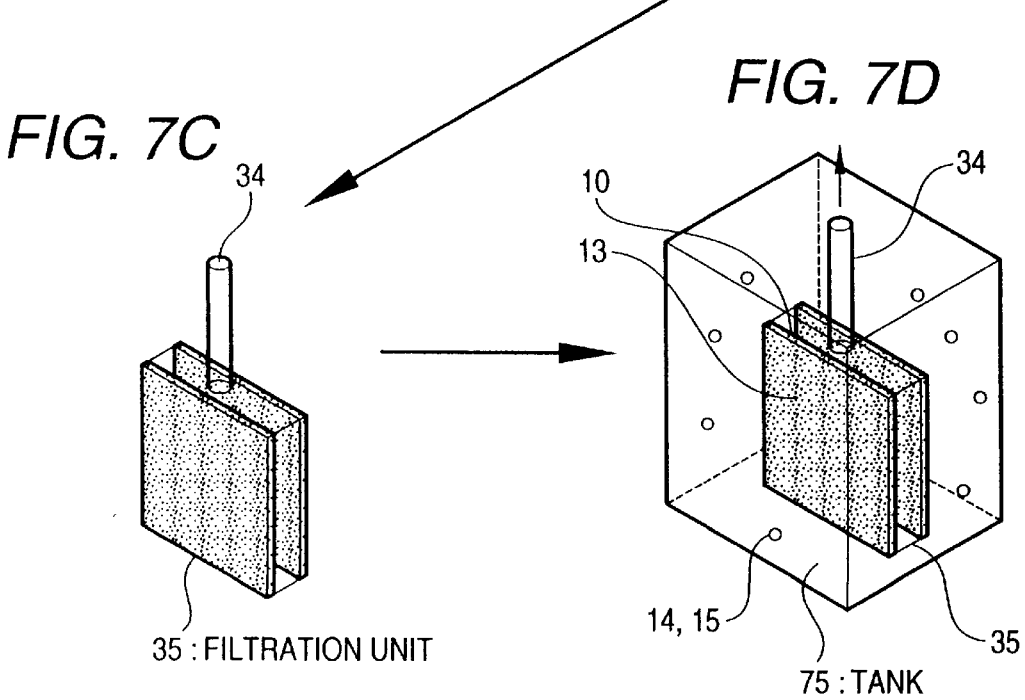
FIG. 7D

FIG. 8A
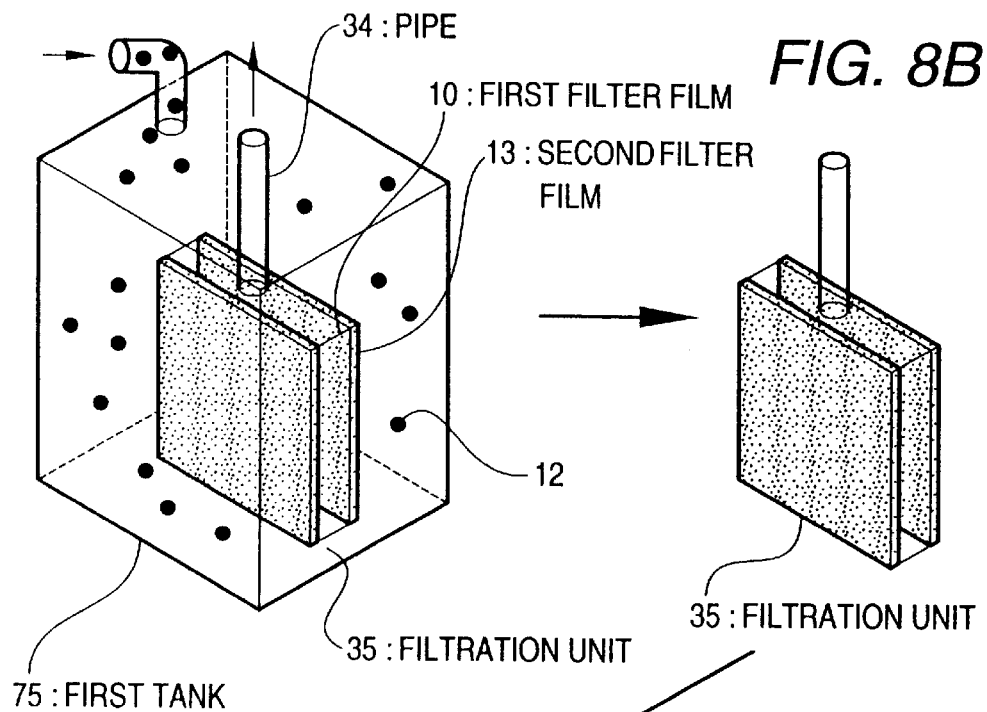
FIG. 8B
FIG. 8C
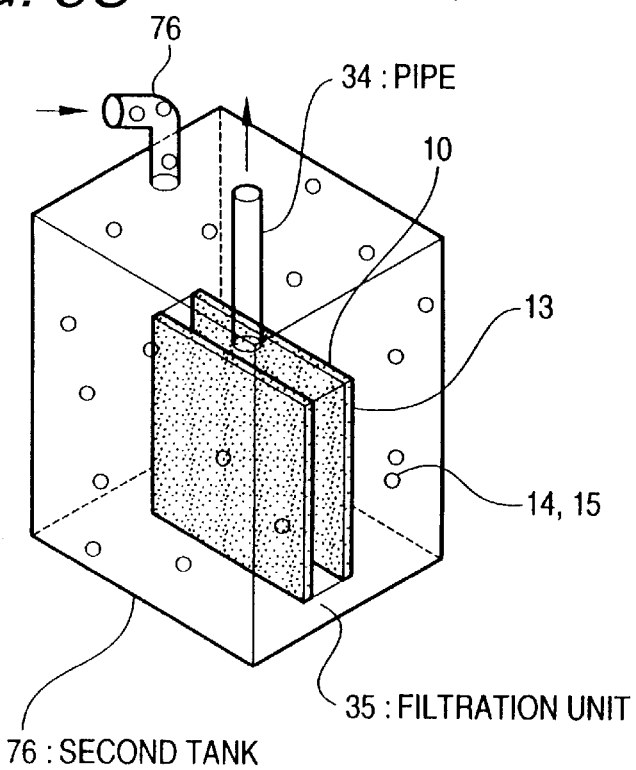

34 : PIPE

35 : FILTERING DEVICE

33 : SPACE

32 : FILTER FILM

30 : FRAME

31 : FILTER FILM

35 : FILTERING DEVICE

FIG. 14A
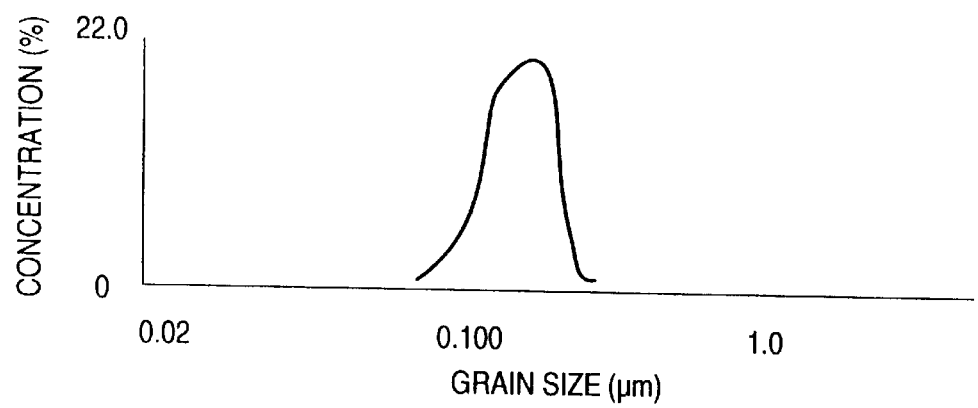
FIG. 14B
| GRAIN SIZE (μm) | FREQUENCY (%) | SUMMATION (%) | GRAIN SIZE (μm) | FREQUENCY (%) | SUMMATION (%) |
|---|---|---|---|---|---|
| 0.076 | 0.552 | 0.552 | 0.172 | 17.630 | 79.192 |
| 0.078 | 1.681 | 2.233 | 0.197 | 10.780 | 89.972 |
| 0.100 | 5.492 | 7.725 | 0.226 | 5.420 | 95.392 |
| 0.115 | 16.618 | 24.342 | 0.259 | 3.383 | 98.775 |
| 0.131 | 19.185 | 43.526 | 0.339 | 0.290 | 100.000 |
| 0.150 | 18.036 | 61.562 | | | |
FIG. 14C
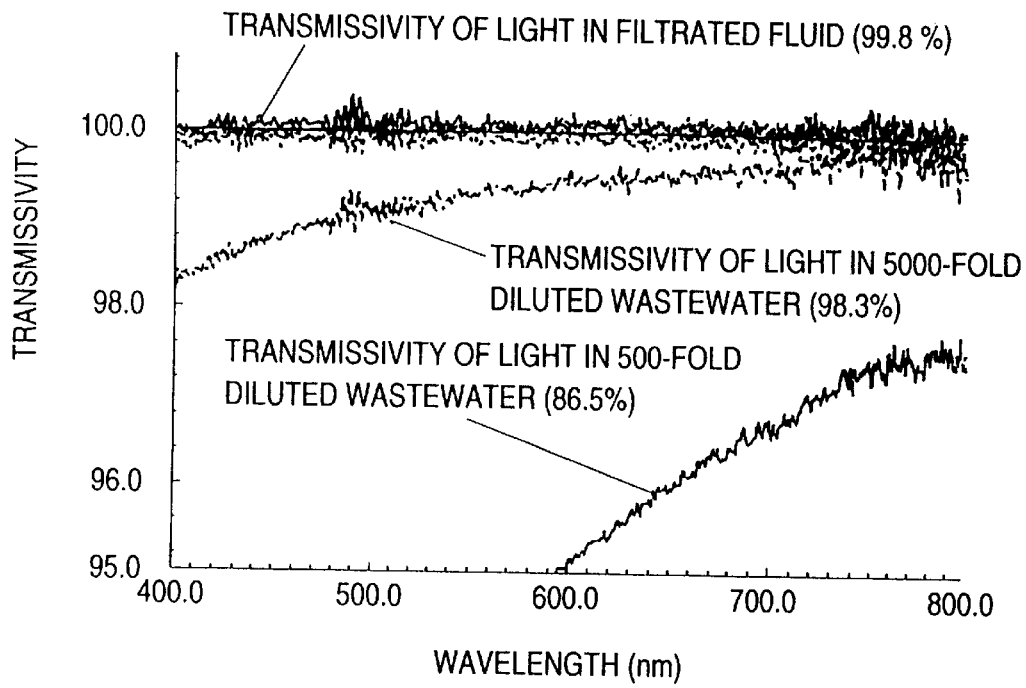

METHOD OF FILTERING A FLUID

BACKGROUND OF THE ART

1. Field of the Invention

The present invention relates to a method of filtering a fluid, and more particularly, to a method of removing, from a fluid, very minute objects of removal measuring 0.1 μm or less.

2. Description of the Related Art

At present, diminishing the amount of industrial waste, separate collection and recycling of industrial waste, and prevention of release of industrial waste are considered to be ecologically-important topics and business issues as society moves toward the Twenty-first century. Some types of industrial waste comprise various types of fluids containing objects of removal; i.e., substances to be removed.

Such fluids are known by a variety of expressions, such as sewage, drainage, and effluent. Fluids, such as water or chemicals, containing substances which are objects of removal will be hereinafter referred to as "wastewater." The objects of removal are eliminated from wastewater by means of an expensive filtration system or a like system. Thus, wastewater is recycled as a clean fluid, and the removed objects of removal or substances which cannot pass through the filtration system are disposed of as industrial waste. Particularly, water is sent back to a natural setting, such as a river or the sea, or recycled after having been purified so as to meet environmental standards.

Adoption of such a filtration system is difficult because of costs incurred in constructing and running a filtration system, thus posing an environmental problem.

As can be seen from the above description, a technique for disposing of wastewater is important in terms of recycling and prevention of environmental contamination, and immediate demand exists for a filtration system incurring low initial and running costs.

By way of illustration, there will now be described disposal of wastewater as practiced in the semiconductor industry. When a plate member formed from, for example, metal, a semiconductor, or ceramics, is ground or abraded, an abrasion (or grinding) jig or the plate member is subjected to a shower of a fluid, such as water, for preventing an increase in the temperature of the abrasion (or grinding) jig, which would otherwise be caused by friction, for improving lubricity, and for preventing adhesion of abrasion or grinding waste to the plate member.

More specifically, at the time of dicing or back-grinding of plate-like semiconductor material; e.g., a semiconductor wafer, pure water is caused to flow over the semiconductor wafer. In a dicing machine, a shower of pure water is caused to flow over a semiconductor wafer, or pure water is squirted onto a blade from a discharge nozzle, in order to prevent an increase in the temperature of a dicing blade or adhesion of dicing waste onto the semiconductor wafer. For the same reason, a flow of pure water is employed during an operation in which a semiconductor wafer is made thin by means of a back-grinding operation.

Wastewater which has mixed therein grinding or abrasion waste and is discharged from the dicing or back-grinding machine is returned to a natural setting or recycled after having been purified through a filter. Alternatively, concentrated wastewater is collected.

In a current process for manufacturing a semiconductor, wastewater in which objects of removal (i.e., waste) primarily consisting of silicon are mixed is disposed of according to either of two methods; i.e., a coagulating sedimentation method and a method which employs a filter and a centrifugal separator in combination.

Under the coagulating sedimentation method, polychlorinated aluminum (PAC) or aluminum sulfate $[Al_2(SO_4)_3]$ is mixed into wastewater as a coagulant so as to react with silicon, to thereby form a reactant. The wastewater is filtrated by removal of the reactant.

Under the method which employs a filter and a centrifugal separator in combination, wastewater is filtrated, and concentrated wastewater is processed by a centrifugal separator, thereby collecting silicon waste as sludge. Clear water resulting from filtration of wastewater is released to a natural setting or recycled.

For example, as shown in FIG. 18, wastewater discharged during a dicing operation is collected into a raw water tank 201 and is sent to a filtration unit 203 by means of a pump 202. A ceramic-based or organic-based filter F is provided in the filtration unit 203, and hence which has been water filtrated through the filter F is delivered, by way of a pipe 204, to a collected water tank 205 wherein the water is recycled. Alternatively, the filtrated water is released to a natural setting.

In the filtration unit 203, wastewater is supplied to the filter F under pressure, thus clogging the filter F. To eliminate clogging of the filter F, the filter F is periodically cleaned. For instance, a valve B1 connected to the raw water tank 201 is closed, and there are opened a valve B3 and a valve B2 for delivering collected water from the collected water tank 205. The water supplied from the collected water tank 205 is used for cleaning the filter F. The resultant wastewater containing a high concentration of silicon waste is returned to the raw water tank 201. Concentrated water in a concentrated water tank 206 is transported to a centrifugal separator 209 by way of a pump 208. In the centrifugal separator 209, the concentrated water is separated into sludge and a separated fluid. Sludge consisting of silicon waste is collected into a sludge recovery tank 210, and the separated fluid is collected into a separated fluid tank 211. After a separated fluid has been further accumulated in the separated water tank 211, the separated fluid is transported to the raw water tank 201 by way of a pump 212.

These methods have been employed even for recapturing waste resulting from grinding or abrasion of a solid or plate-like substance formed essentially from metal material; for example, Cu, Fe, or Al or from grinding or abrasion of a solid or plate-like substance formed from an inorganic substance such as ceramic.

A chemical-and-mechanical polishing (CMP) technique has been adopted as a new semiconductor processing technique. The CMP technique is for smoothing the upper surface of an interlayer dielectric film covering an interconnect in order to materialize an ideal multilayer interconnect structure, wherein irregularities formed in the upper surface of an interlayer dielectric film are chemically and mechanically abraded away.

The CMP technique enables materialization of a smooth device surface. As a result, a minute pattern can be accurately formed on the device through use of the lithography technique. Use of the CMP technique in conjunction with a technique of affixing silicon wafers enables materialization of a three-dimensional integrated circuit.

Second, the CMP technique enables materialization of a structure in which there is embedded material differing from a substrate, thus yielding an advantage of facilitated realization of an embedded interconnect structure. There has been employed a technique of embedding tungsten (W) in a trench of an interlayer film of multilayer interconnect of an IC by means of the CVD technique. The thus-embedded interlayer film is etched back, thus smoothing the surface of the interlayer film. However, smoothing an interlayer film by means of the CMP technique yields an advantage of facilitating a process, and hence the CMP technique has recently come into the limelight.

The CMP technique and applications thereof are described in detail in a periodical entitled "Science of CMP" issued by a science forum.

The mechanism of a machine used for CMP will now be briefly described. As shown in FIG. 19, a semiconductor wafer 252 is placed on an abrasive cloth 251 placed over a rotary table 250. The semiconductor wafer 252 is abraded by being slid over the abrasive cloth 251 while an abrasive (i.e., slurry) 253 is caused to flow over the surface of the semiconductor wafer 252. Further, the semiconductor wafer 252 is chemically etched, thereby eliminating irregularities from the surface of the wafer 252. More specifically, the semiconductor wafer 252 is abraded by means of chemical reaction induced by a solvent included in the abrasive 253, as well as by means of mechanical abrasive action effected by the abrasive cloth 251 and the abrasive 253. Expanded polyurethane or non-woven fabric, for example, is used as the abrasive cloth 251. Further, the abrasive corresponds to a mixture comprising abrasive grains, such as silica or alumina, and water containing a pH regulator. The abrasive is usually called slurry. The semiconductor wafer 252 is brought into slidable and rotatable contact with the abrasive cloth 251 while predetermined pressure is applied to the semiconductor wafer 252 and the slurry 253 is caused to flow over the abrasive cloth 251. Reference numeral 254 denotes a dressing section for maintaining the ability of the abrasive cloth 251 to abrade and keeping the surface of the abrasive cloth 251 in a finished (or dressed) state at all times. Here, reference numerals M1 to M3 designate motors, and reference numerals 255 to 257 designate belts.

As shown in FIG. 20, the mechanism is constructed as a system. The system is roughly divided into a station 260 for loading/unloading a wafer cassette, a wafer transport mechanism section 261, an abrasive mechanism section 262 which has been described by reference to FIG. 19, a wafer cleaning mechanism section 263, and a system controller for controlling these sections.

A cassette 264 having wafers stored therein is disposed in the station 260, and a wafer is taken out of the cassette 264. In the wafer transfer mechanism section 261, the wafer is retained by, for example, a manipulator 265, and is placed on the rotary table 250 disposed in the abrasive mechanism section 262. The wafer is then smoothed by means of the CMP technique. After smoothing of the wafer has been completed, the wafer is transported by means of the manipulator 266 to the wafer cleaning mechanism section 263 wherein the wafer is cleaned. The thus-cleaned wafer is housed in the wafer cassette 264.

The amount of slurry used for one abrasion process is about 500 c.c. to 1 liters/wafer. In the abrasive mechanism section 262 and the wafer cleaning mechanism section 263, pure water flows. The wastewater flowing out of the abrasive mechanism section 262 and the wastewater flowing out of the wafer cleaning mechanism section 263 are finally merged into a single effluent in a drain. Wastewater in an amount of about 5 to 10 liters/wafer flows out during a single smoothing operation. In the case of producing, for example, a wafer of three-layer metal, about seven smoothing operations are required for smoothing metal and interlay dielectric films. For production of a single wafer, wastewater flows out in the amount of seven times the 5 to 10 liters flowing in manufacturing a single IC device completely.

Use of a CMP machine involves discharge of slurry of a considerable amount diluted with pure water, thus posing a difficulty in efficient treatment of wastewater. The wastewater has conventionally been treated by the coagulating sedimentation method or the method which uses a filter and a centrifugal separator in combination and is shown in FIG. 18.

Under the coagulating sedimentation method, a chemical is used as a coagulant. Specifying the amount of chemical which attains complete reaction with objects of removal is very difficult, and hence a large mount of chemical is discharged into the wastewater, so that chemical which has not reacted with wastewater remains. If the amount of chemical is insufficient, not all the objects of removal are coagulated and settled out, so that some of the objects of removal remain unseparated. In a case where a chemical is used excessively, the chemical remains in a supernatant liquid. In a case where the supernatant liquid is recycled, chemical remains in a fluid which has passed through a filter. Hence, the thus-filtered fluid cannot be used for an application in which occurrence of a chemical reaction is to be avoided.

In the case of dicing of a silicon wafer, wastewater comprises silicon waste and distilled water. The water that has been filtrated by the coagulating sedimentation method still contains chemical residue. Therefore, if the thus-filtrated water is applied to a wafer, an undesirable chemical reaction will occur. For this reason, the filtrated water cannot be recycled as water to be used in a dicing operation.

A floc resulting from a reaction between a chemical and an object of removal corresponds to a tuftlike suspended solid. Production of such a floc is achieved under strict pH conditions and requires control equipment for controlling an agitator, a pH measurement instrument, and a coagulant injection apparatus. Stable sedimentation of a floc requires a large-size precipitation tank. For instance, a precipitation tank having the ability to treat wastewater at 3 cubic meters/hour requires a diameter of 3 meters and a depth of about 4 meters (i.e., corresponds to a precipitation tank having a capacity of about 15 $m^3$. As a result, there is required floor space or round space measuring about 11×11 meters, thus rendering the scale of the entire filtration system large.

Further, some flocs float on the surface of wastewater and may flow out of the precipitation tank. Thus, recovery of all flocs is difficult. In short, the known filtration system suffers problems; i.e., the size of a facility, high initial costs required by the system, a difficulty in recycling water, and high running costs incurred by use of a chemical.

Under the method, such as that shown in FIG. 18, which employs a filter having a capability of filtrating 5 cubic meters/hour and a centrifugal separator in combination, the filtration unit 203 uses a filter F (called UF module comprising a polysulfon-based fiber or a ceramic filter), thereby enabling recycling of water. The filtration unit 203 is equipped with four filters F. In view of life of the filters F, the filters F must be replaced with high-priced filters, each costing about 500,000 yen, every year. Further, since the filter F is for use with a pressure filtration method, the pump 202 disposed upstream of the filtration unit 203 must have a high capacity. About two-thirds the wastewater which has passed through the filter F is returned to the raw water tank 201. Further, wastewater containing objects of removal is transported by the pump 202, and hence the interior wall of the pump 202 is scraped by the objects of removal, thus greatly shortening the life of the pump 202.

As mentioned above, the known filtration system suffers high running cost; specifically, electricity consumed by a motor and expenditures required for replacing the pump and the filters F with new ones.

Further, the amount of wastewater discharged during a CMP operation cannot compare with that discharged during a dicing operation, and the abrasive grains mixed in a slurry are very minute and comprise grains of 0.2 $\mu$m, grains of 0.1 $\mu$m, and grains of 0.1 $\mu$m or less. If such fine abrasive grains are filtrated through use of a filter, the abrasive grains enter pores of the filter, thus frequently clogging the filter and making disposal of a large amount of wastewater impossible.

As can be seen from the foregoing description, in order to eliminate a maximum amount of substances harmful to the global environment and recycle a filtrated fluid or separated objects of removal, various devices are added to the effluent filtration apparatus, thus constituting a large-scale filtration system. Eventually, the system involves enormous initial cost and running cost. For these reasons, the known sewage treatment plant cannot be adopted.

SUMMARY OF THE INVENTION

The present invention has been conceived in view of the foregoing problems of the related art and is aimed at providing a sewage treatment method which enables a reduction in initial cost and running cost.

The present invention is also aimed at eliminating objects of removal from a fluid (i.e., wastewater) having mixed therein objects of removal, such as a semiconductor, metal, an inorganic substance, or an organic substance, through use of a filter formed from a solid substance differing from the objects of removal.

The present invention is also aimed at removing objects of removal from a fluid by mixing solid substances into the fluid and causing the fluid to pass through a first filter, to thereby constitute over the surface of the first filter a second filer including the solid substances.

The present invention is also aimed at removing objects of removal from a fluid through use of a filter formed from solid substances differing from the objects of removal.

The present invention is also aimed at removing objects of removal from a fluid by introducing, into a tank having a first filter, a fluid containing the objects of removal and solid substances differing from the objects of removal and by causing the fluid to pass through the first filter, to thereby constitute over the surface of the first filter a second filer containing the solid substances.

Herein, a term "objects of removal" designates solid matter contained in wastewater to be filtrated. The solid substance designates a substance constituting a filter film which is for filtrating wastewater containing objects of removal and is formed by collection of solid matter, such as sand. For example, the solid substance is to be formed into a layer over a first filter film. Therefore, the solid substance preferably has a filtration performance higher than that of the first filter film and is preferably separated into pieces upon receipt of external force.

More specifically, the objects of removal contain a large quantity of grains of about 0.3 $\mu$m, grains of 0.2 $\mu$m, and grains of 0.1 $\mu$m or less. For instance, the objects of removal contain abrasive grains used for a CMP operation, waste semiconductor material resulting from grinding of a semiconductor material with the abrasive grains, metal waste and/or waste material for a dielectric film.

The objects of removal correspond to waste arising when a crystalline ingot is sliced into wafers, when a semiconductor wafer is diced, and when a semiconductor wafer is subjected to back-grinding. Primarily, the objects of removal correspond to semiconductor material, insulating material, metal material, silicon (Si), silicon oxide, aluminum, SiGe, an organic substance such as a sealant, another insulating film material, or a metal material. In the case of a compound semiconductor, a compound semiconductor material, such as GaAs, corresponds to an object of removal.

A dicing technique has recently been employed for manufacturing a chip-size package (CSP). Semiconductor material, ceramic material, and sealant, which would arise during the dicing of a wafer, also correspond to an object of removal.

Objects of removal arise in various industries other than the semiconductor industry. For example, in industries using glass, formation of a panel, such as a liquid-crystal panel or an electroluminescence (EL) display, involves dicing of a glass substrate and abrasion of side surfaces of a substrate. Therefore, in this field, glass waste corresponds to objects of removal. Further, power companies and steel producers use coal as fuel, and fine particles originating from coal correspond to objects of removal. Further, fine particles mixed in smoke emitted from a smoke stack also correspond to objects of removal. Fine particles resulting from machining of minerals, gems, and gravestones also correspond to objects of removal. Further, metal waste resulting from lathing of metal and ceramic waste resulting from dicing or abrasion of a ceramic substrate also correspond to objects of removal.

These types of waste are produced when material is subjected to machining, such as abrasion, grinding, or pulverization. In order to remove the waste, the waste is mixed into a fluid, such as water or a chemical, thus producing wastewater.

Solid substances correspond to substances which are distributed over a range of particle size (about 500 $\mu$m) wider than a distribution of particle size (about 0.14 $\mu$m) of objects of removal (i.e., abrasive grains used for a CMP operation) For example, solid substances correspond to semiconductor material, such as Si; grinding, abrasion, or pulverized waste, such as metal; or solid substances having a distribution equal to the above-described distribution of particle size; for example, diatomaceous earth or zeolite.

In the present invention, objects of removal are removed from a fluid through use of a filter containing solid substances differing from the objects of removal.

Further, objects of removal are removed from a fluid through use of a filter containing solid substances whose distribution of particle size is wider than that of the objects of removal.

Further, objects of removal are removed from a fluid by mixing solid substances into the fluid and causing the fluid to pass through a first filter, to thereby constitute over the surface of the first filter a second filter containing the solid substances.

In order to eliminate a particulate matter of 0.1 $\mu$m, such as an abrasive grain to be mixed into a slurry for use in a CMP operation, a filter film having pores smaller than the particulate matter is generally employed. However, in the present invention, a solid substance which is substantially equal in size with or greater in size than an object of removal is formed into a layer on the surface of the first filter, to thereby constitute a second filter film. A plurality of apertures formed in the second filter film are utilized as passages for a fluid. In the present invention, the second filter per se is a cluster of solid substances. Therefore, objects of removal and a surface layer of solid substances, which would cause clogging, can be spaced from the second filter film, thus maintaining the filtration ability of the second filter film.

In the present invention, objects of removal are removed by mixing into a fluid solid substances which are greater in diameter than those of the objects of removal and causing the fluid to pass through a first filter, to thereby constitute over the surface of the first filter a second filter containing the solid substances.

Use of the first filter enables formation over the first filter of a second filter film to be formed from solid substances. The second filter film removes objects of removal.

In the present invention, objects of removal are removed from a fluid through use of a filter formed from solid substances differing from the objects of removal contained in the fluid.

Further, after a filter has been formed from solid substances differing from objects of removal contained in a fluid, the objects of removal are removed from the fluid through use of the filter.

Further, a first filter is immersed in a fluid, and solid substances differing from objects of removal contained in the fluid are caused to pass through the first filter, to thereby constitute over the surface of the first filter a second filter containing the solid substances. Thereafter, a fluid containing the objects of removal is caused to flow through the first and second filters, thus removing the objects of removal from the fluid.

So long as a filter containing solid substances is prepared beforehand, a fluid stored in a tank can be filtrated immediately. Further, a second filter can be formed within the fluid. If a fluid containing objects of removal is caused to flow through the second filter, formation of the second filter and filtration of a fluid through the second filter can be carried out continuously.

A fluid containing objects of removal and solid substances differing from the objects of removal is introduced into a tank having a first filter, and the fluid is caused to pass through the first filter, thereby constituting over the surface of the first filter a second filter containing the solid substances. Thus, the objects of removal are eliminated from the fluid.

If the second filter film is formed from only objects of removal, the second filter film is formed to have small filter pores, so that the filtration capability of the second filter film is deteriorated. However, if solid substances are mixed into the second filter film, apertures of various sizes are formed in the second filter film, thereby enabling an increase in the rate of filtration of a fluid.

Since the fluid is acidic or alkaline, a neutralizer is mixed into the fluid, thus neutralizing the fluid.

Preferably, the fluid is caused to circulate through the filter or the first filter. As a result of circulation of the fluid, the objects of removal contained in the fluid and solid substances accumulate as a second filter film having the capability of capturing objects of removal of a predetermined particle size.

Preferably, the filter or the second filter contains solid substances or objects of removal of different sizes.

Particularly, so long as solid substances of different sizes are employed, the solid substances are randomly stacked into layers, thus increasing the number of apertures and constituting apertures of different sizes. Consequently, flow channels for a fluid can be ensured, thus increasing the rate of filtration of a fluid.

The solid substances or the objects of removal contain particles of different sizes, and the pores of the first filter are greater in size than the smallest grain and smaller in size than the largest grain.

The diameter of the smallest solid substance or objects of removal is less than 0.25 $\mu$m, and the diameter of the largest solid substance or the objects of removal is greater than 10 $\mu$m.

Solid substances or objects of removal are separated into pieces, as is sand. In order to form a film from the solid substances or the objects of removal, a support member must be placed below the film. For this reason, the first filter film is used as a support member, thus enabling formation of a second filter film over the first filter film. Further, so long as a pore formed in the first filter film is set to be greater in size than the smallest grain and smaller in size than the largest grain, large grains are first captured, and smaller grains are gradually captured later. Although the second filter film originally has apertures of large size, the filter yields an advantage of the ability to permit filtration of a fluid at a rate higher than that filtrated by a filter having apertures of small sizes.

The grain size distribution of the solid substances or the objects of removal shows two peaks, and the size of the pores of the first filter falls within the range between the two peaks.

Solid substances or objects of removal which are greater in size than the apertures of the first filter are present in greater proportion than are solid substances or objects of removal which are smaller in size than the apertures of the first filter.

Solid substances or objects of removal have a wide grain size distribution. Presence of solid substances or objects of removal of large sizes enables random formation of large apertures in the second filter film. Accordingly, a fluid can be filtrated at low suction pressure.

Preferably, after commencement of removal of objects of removal in a filtering process employing the first filter, a fluid is caused to circulate for a predetermined period of time.

After commencement of removal of objects of removal in a filtering process in which the first filter is used, a fluid is, in advance, caused to circulate for a predetermined period of time. As a result, the objects of removal are deposited on the surface of the first filter, thus forming a second filter film. Subsequently, the fluid is filtrated through the first and second filters. So long as the time during which a second filter film is formed as a result of circulation of a fluid can be determined, a second filter film can be formed through use of a timer after a new first filter film has been attached to a filtration unit, without involvement of a necessity for ascertaining formation of the second filter film. In the event of a clog arising in the filtration unit, the second filter film is removed together with the sediment formed on the filter film, and a fluid is caused to circulate, thus enabling automatic recovery of the second filter film. So long as the time required for collecting the second filter film through filtration of a fluid can be determined, the second filter film can be collected through use of a timer.

The degree to which the solid substances or the objects of removal still remain in the fluid that has passed through the first filter is detected by detection means. When the degree to which the objects of removal or solid substances are mixed in the fluid has reached a predetermined value or less, circulation of the fluid is stopped.

More specifically, after the degree to which the objects of removal are mixed in the fluid has reached a predetermined value or less, formation of a second filter film has been visually ascertained, and achievement of a sufficient filtrating effect has been found, circulation of the fluid is stopped, and the fluid is introduced into a filtration process, thereby enabling automatic recovery of the second filter film.

The degree to which the solid substances or the objects of removal still remain in the fluid that has passed through the first filter is detected by detection means. When the degree to which the objects of removal or solid substances are mixed in the fluid has reached a second predetermined value or more, circulation of the fluid is resumed.

Each aspect of the method described below is separately illustrative of the various embodiments of the invention and is not intended to be restrictive of the broad invention.

Namely, a first aspect of the method is a method of filtering a fluid, which comprises steps of:

preparing a filter containing solid substances differing from the objects of removal; and filtering objects by supplying the fluid to the filter and thereby removing the objects of removables from the fluid.

A second aspect of the method is a method of filtering a fluid according to the first aspect, wherein the step of preparing a filter comprises a step of forming a second filter by depositing the solid on a first filter as a base.

A third aspect of the method is a method of filtering a fluid according to the first aspect, wherein said solid contains solid substances whose distribution of particle size is wider than that of the objects of removal.

A fourth aspect of the method is a method of filtering a fluid according to the first aspect, wherein the step of preparing a filter comprises steps of:

mixing a solid substance to the fluid containing objects of removal; and forming a second filter by causing the fluid to pass through a first filter, to thereby constitute over the surface of the first filter a second filter containing the solid substances.

A fifth aspect of the method is a method of filtering a fluid according to the first aspect, wherein the step of preparing a filter comprises steps of:

mixing a solid substance whose diameter is larger than that of objects of removal to the fluid; and forming a second filter by causing the fluid to pass through a first filter, to thereby constitute over the surface of the first filter a second filter containing the solid substances.

A sixth aspect of the method is a method of filtering a fluid according to the first aspect, wherein the step of preparing a filter comprises a step of:

forming a filter containing a solid substance whose composition is different from that of the objects of removal in the fluid.

A seventh aspect of the method is a method of filtering a fluid according to the first aspect, wherein the step of preparing a filter comprises the steps of:

mixing a solid substance whose composition is different from that of the objects of removal to the fluid; and forming a second filter by causing the fluid to pass through a first filter, to thereby constitute over the surface of the first filter a second filter containing the solid substances.

An eighth aspect of the method is a method of filtering a fluid according to the first aspect, wherein the step of preparing a filter comprises the step of:

forming a second filter by immersing a first filter in a fluid containing a solid substance different from objects of removal to thereby constitute over the surface of the first filter a second filter containing the solid substances different from objects of removal; and introducing a fluid containing objects of removal to the filter, thereby removing objects of removal contained in a fluid.

A ninth aspect of the method is a method of filtering a fluid, which comprises the steps of:

introducing a fluid containing objects of removal and solid substances differing from the objects of removal into a tank having a first filter;

causing the fluid to pass through the first filter, thereby constituting over the surface of the first filter a second filter containing the solid substances and eliminating the objects of removal from the fluid.

A tenth aspect of the method is a method of filtering a fluid according to the first aspect, wherein the fluid is acidic or alkaline, and a neutralizer is mixed into the fluid, thus neutralizing the fluid.

An eleventh aspect of the method is a method of filtering a fluid according to the first aspect, wherein the step of preparing a filter comprises a step of causing the fluid containing objects of removables to circulate through the filter or the first filter.

A twelfth aspect of the method is a method of filtering a fluid according to the second aspect, wherein the filter or the second filter contains solid substances or objects of removal of different sizes.

A thirteenth aspect of the method is a method of filtering a fluid according to the second aspect, wherein the solid substances or the objects of removal contain particles of different sizes, and pores of the first filter are greater in size than the smallest grain and smaller in size than the largest grain.

A fourteenth aspect of the method is a method of filtering a fluid according to the second aspect, wherein the solid substances or the objects of removal contain flake state particles, and pores of the first filter are greater in size than the smallest grain and smaller in size than the largest grain.

A fifteenth aspect of the method is a method of filtering a fluid according to the second aspect, wherein the diameter of the smallest solid substance or objects of removal is less than 0.25 $\mu$m, and the diameter of the largest solid substance or the objects of removal is greater than 10 $\mu$m.

A sixteenth aspect of the method is a method of filtering a fluid according to the second aspect, wherein the grain size distribution of the solid substances or the objects of removal shows two peaks, and the size of the pores of the first filter falls within the range between the two peaks.

A seventeenth aspect of the method is a method of filtering a fluid according to the second aspect, wherein solid substances or objects of removal which are greater in size than the apertures of the first filter are present in greater proportion than are solid substances or objects of removal which are smaller in size than the apertures of the first filter.

An eighteenth aspect of the method is a method of filtering a fluid according to the first aspect, wherein said step of filtering comprises a step of circulating the fluid for a constant time since starting removing.

A nineteenth aspect of the method is a method of filtering a fluid according to the eighteenth aspect, wherein said step of circulating comprises a step of detecting an inclusion degree of removables included in the fluid passing through the filter, and stopping circulation of the fluid at the time when the inclusion degree has fallen bellow the predetermined value.

A twentieth aspect of the method is a method of filtering a fluid according to the nineteenth aspect, wherein said step of circulating comprises a step of detecting an inclusion degree of removables included in the fluid passing through the filter, and starting circulation of the fluid again at the time point when the detected degree exceeds a second constant value.

A twenty first aspect of the method is a method of filtering a fluid according to the nineteenth aspect, wherein said step of detecting comprises a step of detecting a transparence of the fluid by light sensor.

A twenty second aspect of the method is a method of filtering a fluid according to the first aspect, wherein said step of filtering comprises a step of filtering the fluid while sucking through the filter.

A twenty third aspect of the method is a method of filtering a fluid according to the twenty second aspect, wherein an applied suction pressure in sucking is within a range of 0.2 to 0.5 $kg/cm^2$.

A twenty fourth aspect of the method is a method of filtering a fluid according to the second aspect, further comprising a step of applying an external force to a surface of the filter so that a constituent of the second filter can be moved.

A twenty fifth aspect of the method is a method of filtering a fluid according to the twenty fourth aspect, wherein said step of applying an external force comprises a step of applying the external force intermittently.

A twenty sixth aspect of the method is a method of filtering a fluid according to the twenty fourth aspect, wherein said step of applying an external force comprises a step of applying gas flow along a surface of the first filter.

A twenty seventh aspect of the method is a method of filtering a fluid according to the twenty fourth aspect, wherein said step of applying an external force comprises a step of applying a force so as to make a part of the constituent of the second filter released.

A twenty eighth aspect of the method is a method of filtering a fluid according to the twenty fourth aspect, wherein said step of applying an external force comprises a step of controlling a force so that a thickness of the second filter is constant.

A twenty ninth aspect of the method is a method of filtering a fluid according to the twenty fourth aspect, wherein said filter is disposed in perpendicular direction and said external force comprises a raising force of a bubble.

A thirtieth aspect of the method is a method of filtering a fluid according to the twenty fourth aspect, wherein said step of applying an external force comprises a step of applying a mechanical vibration.

A thirty first aspect of the method is a method of filtering a fluid according to the twenty fourth aspect, wherein said step of applying an external force comprises a step of generating a sonic wave.

A thirty second aspect of the method is a method of filtering a fluid according to the twenty fourth aspect, wherein said step of applying an external force comprises a step of generating a flow of the fluid.

A thirty third aspect of the method is a method of filtering a fluid according to the second aspect, wherein said first filter is made of polyolefin high polymer.

A thirty fourth aspect of the method is a method of filtering a fluid according to the second aspect, wherein said first filter has an uneven surface.

A thirty fifth aspect of the method is a method of filtering a fluid according to the second aspect, wherein said first filter has a bag typed filter in which clearance is formed and in which suction pipe for sucking is inserted.

A thirty sixth aspect of the method is a method of filtering a fluid according to the second aspect, wherein said second filter comprises at least one element of Si, SiGe, $Al_2O_3$, Si oxide, metal oxide, and IIa–VIIa, IIb–VIIb group of elements.

A thirty seventh aspect of the method is a method of filtering a fluid according to the second aspect, wherein said second filter comprises Si.

A thirty eight aspect of the method is a method of filtering a fluid according to the thirty seventh aspect, wherein said second filter comprises flake type of Si.

A thirty ninth aspect of the method is a method of filtering a fluid according to the second aspect, wherein said second filter comprises a mechanical processing waste generated in the mechanical processing step.

A fortieth aspect of the method is a method of filtering a fluid according to the thirty ninth aspect, wherein said mechanical processing step comprises a polishing step or grinding step.

A forty first aspect of the method is a method off filtering a fluid according to the thirty eighth aspect, wherein said mechanical processing waste is a waste of dicing.

A forty second aspect of the method is a method of filtering a fluid according to the forty first aspect, wherein said step of preparing a filter comprises a step of adding a flake shaped waste in to the fluid.

A forty third aspect of the method is a method of filtering a fluid according to the first aspect, wherein said fluid is fine particles wasted in a mechanical processing step.

A forty fourth aspect of the method is a method of filtering a fluid according to the first aspect, wherein said fluid is fine particles wasted in a CMP step.

BRIEF DESCRIPTION OF THE DRAWINGS

FIGS. 7A to 7D are illustrations for describing a method of preparing a filter film;

FIGS. 8A to 8C are illustrations for describing a method of preparing a filtration unit equipped with filter films;

FIGS. 14A to 14C are illustrations for describing the size distribution of abrasive grains used for a CMP operation and the transmissivity of light before and after filtration of a fluid;

BEST MODES FOR CARRYING OUT THE INVENTION

Preferred embodiments of the present invention will now be described by reference to the accompanying drawings.

In one embodiment, wastewater discharged during a semiconductor process; particularly, a dicing process, is used as a fluid. Next will be described in detail a case where dicing waste of semiconductor wafer is contained in the wastewater.

One of the features of the present invention resides in a filter. Therefore, the structure of a filter, a method of producing the filter, and the operation of the filter will now be described.

Figure 1A:
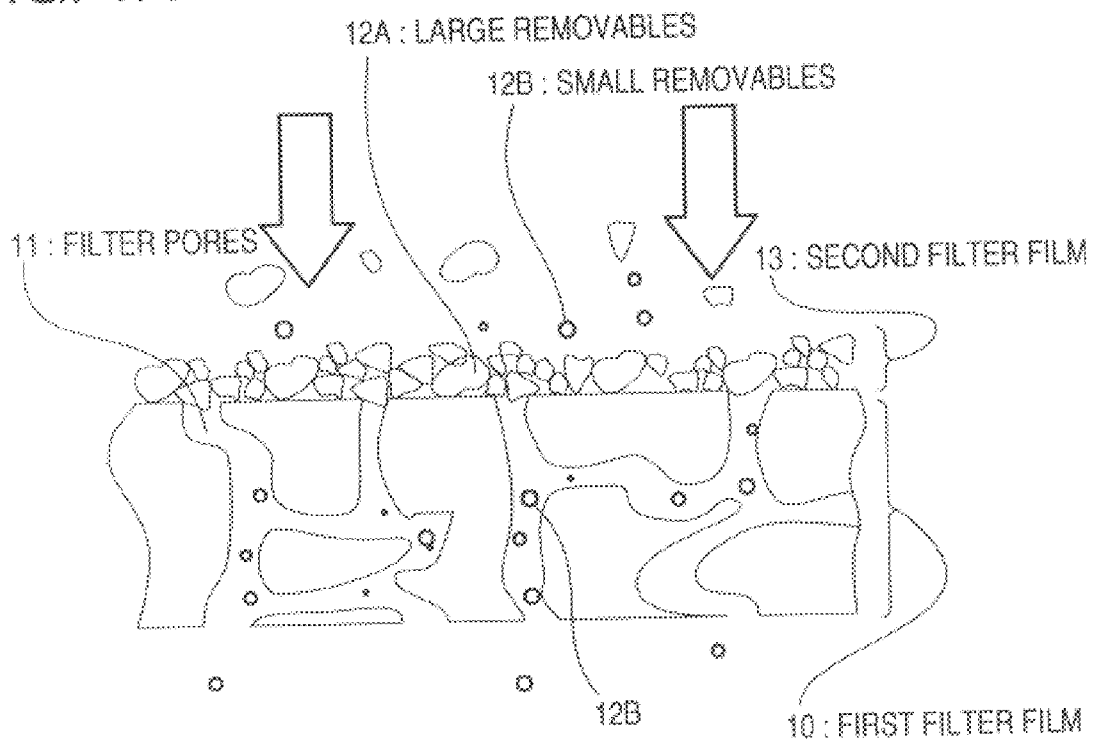
FIGS. 1A and 1B are illustrations for describing a filter film according to an embodiment of the present invention.
Figure 1B:
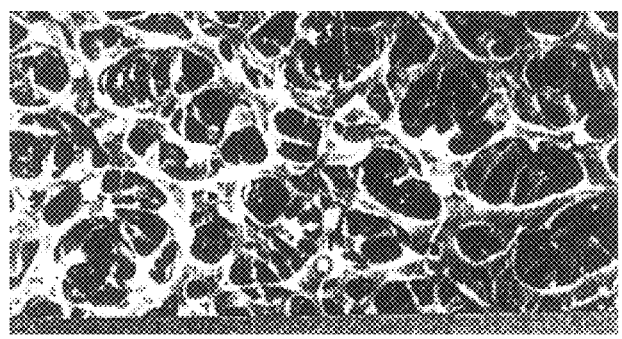
Figure 3:
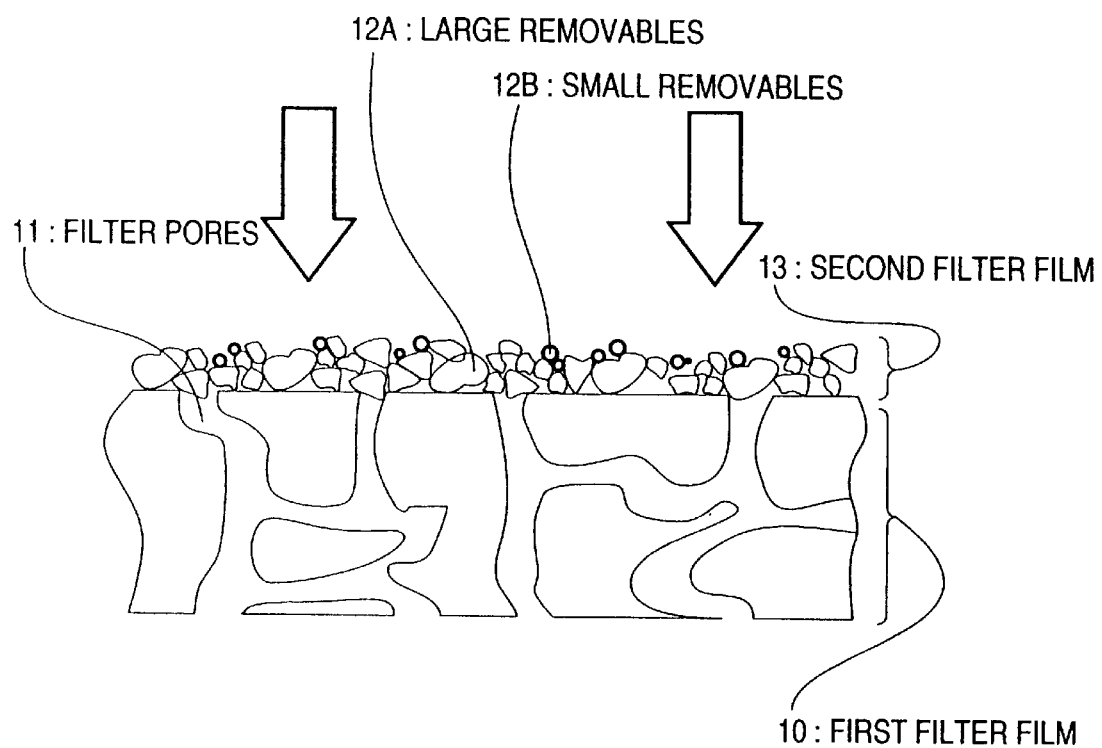
FIG. 3 is an illustration for describing a filter film according to the present embodiment.

As can be seen from a schematic representation of a process for manufacturing a filter shown in FIG. 1A, dicing waste contained in wastewater is deposited on a first filter film 10 having filter pores 11, thus constituting a second filter film 13. In this way, a fine-meshed filter of superior performance is produced. A film formed over the openings of the filter pores 11 and on the surface of the first filter 10 is a cluster of solid substances 12. The solid substances 12 can be divided into large solid substances 12A which cannot pass through the filter pores 11 and small solid substances 12B which can pass through the filter pores 11. In the drawing, the small solid substances 12B which can pass through the filter pores 11 are designated by solid circles. The solid substances 12A and the small solid substances 12B, which are contained in the wastewater, are gently deposited in the filter pores 11 and on the first filter 10 while interacting with each other, thereby constituting apertures which are smaller than the minimum grains of the solid substance, as shown in FIG. 3. Thus, a much finer-meshed filter is formed. In principle, either an organic macromolecular film or a ceramic-based film can be adopted as the first filter film 10. In the present embodiment, there is adopted a polyolefine-based macromolecular film having a mean pore size of 0.25 $\mu$m and a thickness of 0.1 mm. A photographic image of the surface of a polyolefine-based filter film is shown in FIG. 1B.

Next will be described a method of forming a filter.

As shown in FIG. 1A, wastewater having solid substances mixed therein is located above the first filter film 10, and water which has been filtrated by the first filter film 10 is generated at a position below the first filter film 10. The wastewater is caused to flow in the direction designated by the arrows. In order to filtrate the wastewater through use of the filter film 10, the wastewater is dropped by gravity or is caused to flow under pressure in a downward direction in FIG. 1A. Further, the wastewater is suctioned toward the direction in which filtrated water is produced. Although in the present embodiment the first filter film 10 is provided horizontally, the film 10 may be disposed vertically.

As mentioned previously, since the wastewater is pressurized or suctioned by way of the filter film 10, the wastewater passes through the first filter film 10. At this time, the large solid substances 12a which cannot pass through the filter pores 11 are captured on the surface of the first filter film 10.

The solid substances resulting from mechanical machining, such as grinding, abrasion, or pulverization have a size (grain size) distribution within a certain range and differ in shape from one another. Further, dicing waste of silicon used herein has a grain size distribution such as that shown in FIG. 2A. As can be seen from a microphotograph provided in FIG. 2B, the dicing waste has a grain size distribution ranging from 0.1 $\mu$m to 200 $\mu$m and assumes a variety of geometries.

Solid substances are randomly located within the wastewater in which the first filter film 10 is immersed. The large solid substances 12A and the small solid substances 12B migrate to the filter pores 11. The large solid substances 12A which are randomly captured by the filter film 10 constitute a first-stage layer of the second filter film 13. This first-stage layer constitutes filter pores smaller than the filter pores 11, and solid substances ranging from the large solid substances 12A to the small solid substances 12B are sequentially captured by way of the thus-constituted small pores. Since the solid substances differ in shape from one another, minute apertures of various shapes are formed between solid substances, and wastewater flows through the apertures, which serve as channels. Finally, the wastewater is filtrated. Such filtrating action is closely analogous to filtrating action of well-drained sands.

The filtrating action of the filter will now be described.

The second filter film 13 formed over the first filter film 10 randomly captures solid substances ranging in size from the large solid substances 12A to the small solid substances 12B, thus gradually growing. The thus-grown second filter 13 comes to entrap the smaller solid substances 12B while ensuring flow channels of wastewater (i.e., a fluid), as shown in FIG. 3. The second filter film 13 remains over the first filter film 10 in the form of only a layer, and the solid substances entrapped by the second filter film 13 can be readily moved, as can grains of sand. The sediment deposited on the surface of the second filter film 13 can be readily moved toward wastewater by causing bubbles to flow in the vicinity of the surface of the second filter film 13, by application of a stream, sound waves, ultrasonic waves, or mechanical vibration to the surface of the second filter film 13, or by scrubbing the surface of the second filter film 13 through use of a squeegee. The second filter film 13 can be readily moved and separated into pieces, and hence even if the filtration capacity of the second filter film 13 deteriorates, the second filter film 13 can readily collect its filtration capability by application of external force thereto. Put another way, deterioration in the filtration capability of the filter is ascribable primarily to a clog. Solid substances deposited on the surface of the second filter film 13, which are ascribable to a clog, again migrate into the fluid, thus repeatedly eliminating a clog and sustaining the filtration capability of the filter.

Figure 2A:
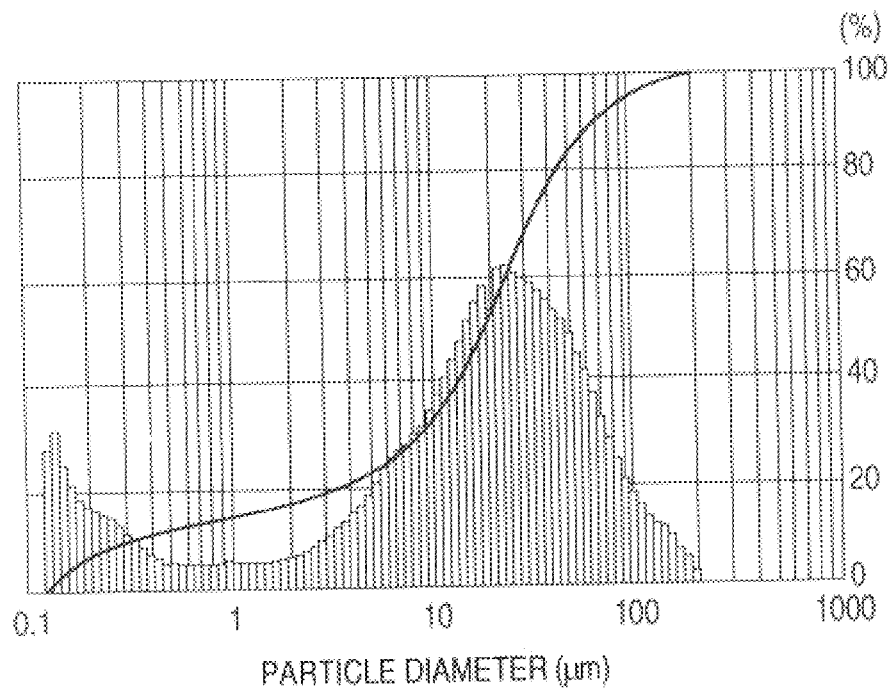
FIGS. 2A and 2B are illustrations for describing the size distribution and geometry of silicon waste contained in wastewater discharge during dicing of a silicon wafer.
Figure 2B:
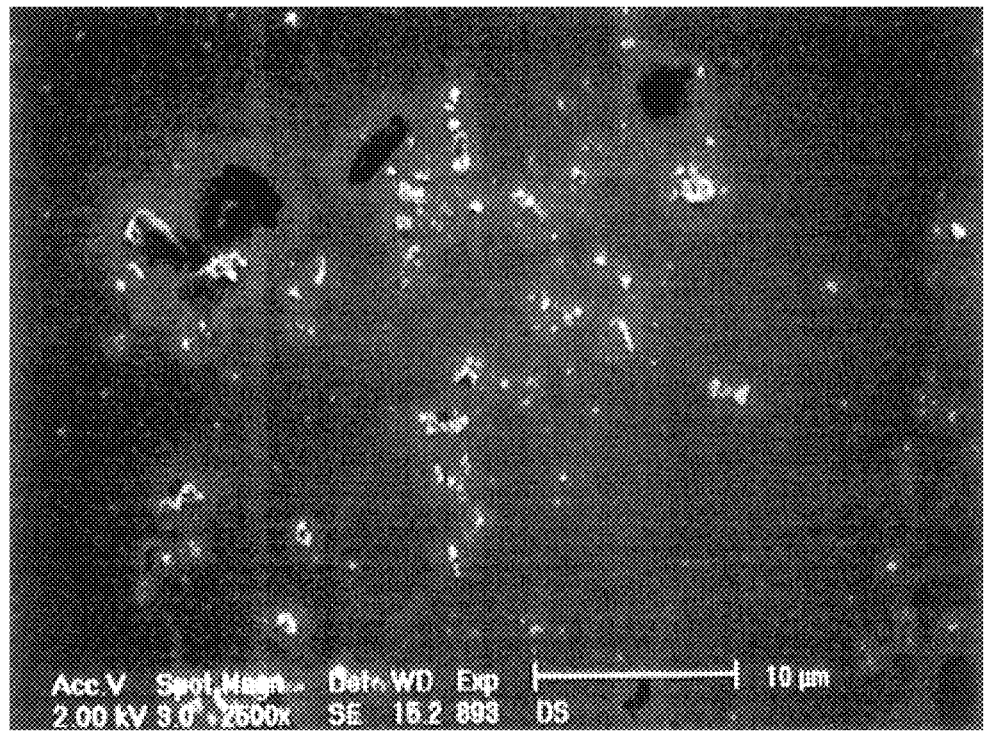

With regard to the graph shown in FIG. 2A, the apparatus used for measuring the grain size distribution of dicing waste cannot detect grains smaller than 0.1 μm. Hence, the graph does not show a distribution of grinding waste of 0.1 μm or less. Observation of the photographic image of the dicing waste shown in FIG. 2B shows that grains smaller than 0.1 μm are actually contained in the dicing waste. The test shows that, when the wastewater having dicing waste mixed therein is filtrated by the filter, a layer of dicing waste was formed over the first filter film, thus entrapping dicing waste of 0.1 μm or less.

For example, if an attempt is made to eliminate dicing waste measuring 0.1 μm, a conventional technique is to employ a filter having pores smaller than the dicing waste. However, in the case of elimination of a mixture of dicing waste of small grain size and dicing waste of large grain size, it is understood from the foregoing description that dicing waste of 0.1 μm or less can be entrapped even when there is employed a filter having filter pores of an intermediate grain size.

If the grain size distribution of solid substances shows only one peak, at a grain size of 0.1 μm, and extends within a very narrow range of several micrometers, a filter will become clogged immediately. As can be seen from FIG. 2A, the grain size distribution of dicing waste of silicon, which corresponds to solid substrates, shows two peaks; one for dicing waste of large grain sizes and the other for dicing waste of small grain sizes. Further, the grain size distribution of dicing waste extends over a wide range from 0.1 μm to 200 μm. Consequently, the filtration capability of the filter is improved correspondingly. Further, as shown in FIG. 2B, observation of dicing waste of silicon under an electron microscope shows that solid substances vary widely in terms of geometry. Therefore, various apertures varying in size and geometry are formed between solid substrates, thereby constituting flow channels for wastewater. It is thought that a filter less susceptible to clogging and capable of entrapping waste of 0.1 μm or less is embodied by means of presence of such apertures.

If the distribution of solid substances becomes offset left or right in the drawing, the sizes of filter pores of the first filter film 10 may be changed in accordance with the distribution. In general, the larger pore sizes, the greater the amount of solid substance passing through a filter film. However, so long as the time during which wastewater is circulated is extended, most of the solid substances can be finally entrapped by the second filter film 13. Naturally, the smaller the pore size of the filter, the shorter the time required for the filter to gain the ability to entrap small solid substances.

As mentioned above, it is seen that, so long as solid substances ranging from 0.1 μm or less to 200 μm form the second filter film 13 on the surface of the first filter film 10, even solid substances of 0.1 μm or less can be eliminated. Here, the maximum grain size is not limited to 200 μm and may be set to a much large grain size. For instance, solid substances having a grain size distribution from 0.1 μm to 500 μm can be filtrated.

Figure 4:
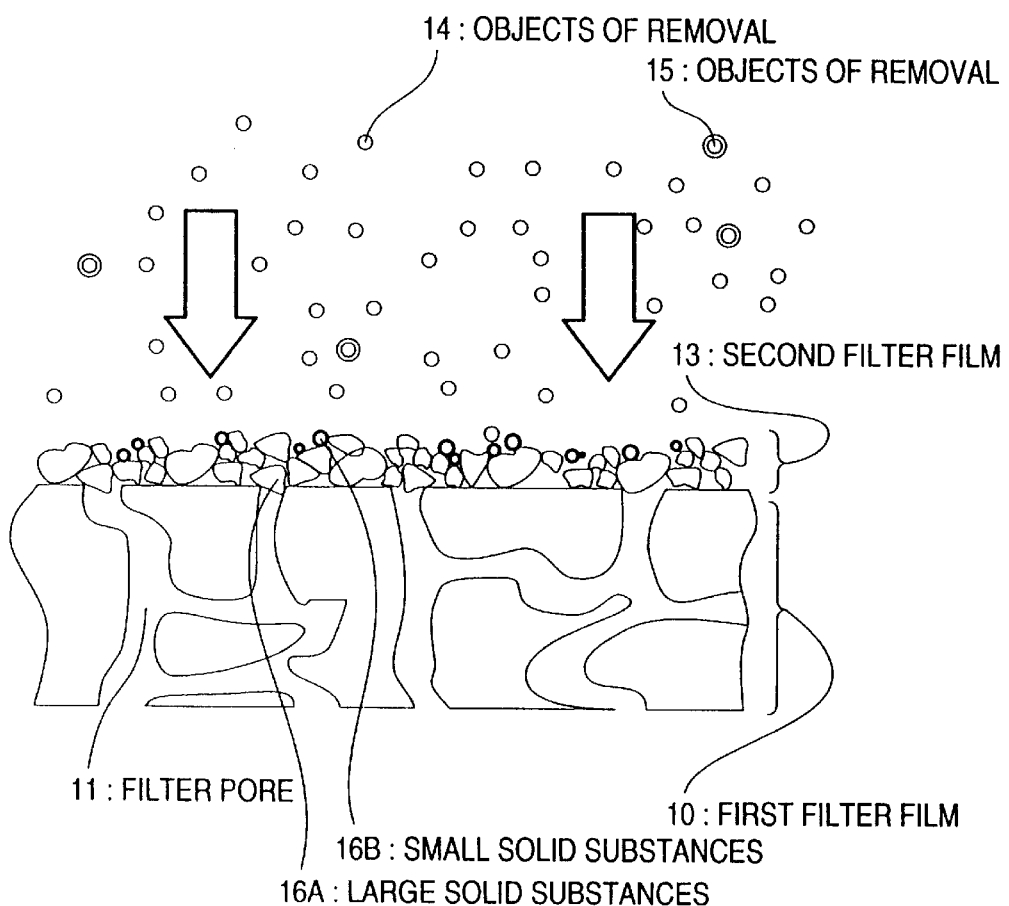
FIG. 4 is an illustration for describing the filter film according to the present embodiment.

As in the case of a filter shown in FIG. 4, in a case where wastewater—in which objects of removal 14 and 15 differing in type from the solid substances 12 are mixed—and the wastewater having solid substances of dicing waste mixed therein are caused to pass through the filter after the filter has been formed from the solid substances 12, it is understood that the objects of removal 14 and 15 can be eliminated.

In the previous embodiment, the underlying principle of the present invention has been described. Next will be described an example in conformity with a situation in which the filter is actually used.

In practice, there may be employed two methods; a method under which the second filter film 13 is formed from the solid substances (or solid substances 12 and objects of removal) within a single tank, and wastewater is filtrated through use of the second filter film 13; and another method under which the second filter 13 is moved to a tank after having been formed within another tank.

Figure 5A:
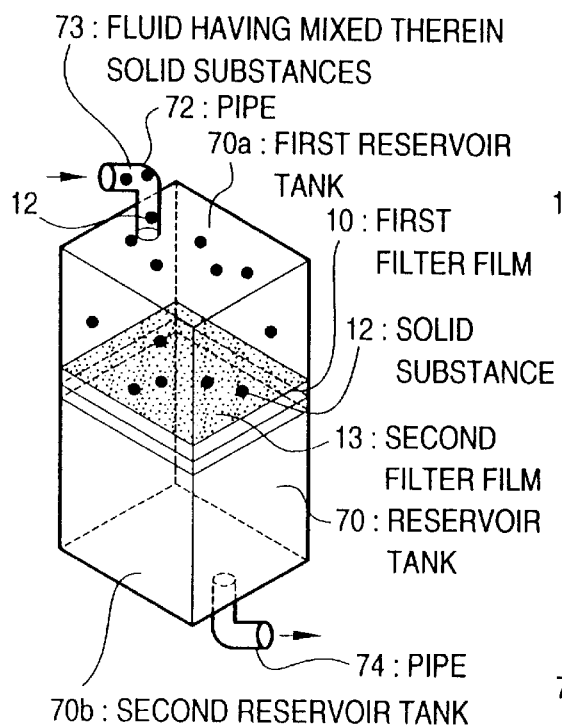
FIGS. 5A to 5C are illustrations for describing a method of forming a film from solid substances or from objects of removal and solid substances.

First through fourth methods falling under the former method, under which a filter film is formed within a single tank, are carried out in such a manner as shown in FIGS. 5A to 6B, prior to an actual filtration process. In the present example, as shown in FIGS. 5A to 5C, there is employed a method under which, after the second film 13 has been grown on the surface of the first filter film 10 while the first filter film 10 is sandwiched between a first reservoir tank 70a and a second reservoir tank 70b, wastewater containing objects of removal is introduced into the reservoir tank and subjected to filtration.

As shown in FIG. 5A, according to a first method, a reservoir tank 70 is separated into a first reservoir tank 70a and a second reservoir tank 70b, with the first filter film 10 sandwiched therebetween. A fluid 73 containing the solid substances 12 (for example, dicing waste of silicon) is caused to flow into the first reservoir tank 70a from a pipe 72. The fluid 73 is caused to migrate to the second reservoir tank 70b by force of gravity, application of pressure to the fluid 73 stored in the first reservoir tank 70a or suction of the fluid 73. During migration, the solid substances 12 are entrapped by the first filter film 10, thus constituting the second filter film 13. Subsequently, as shown in FIG. 5B, a fluid 73' having mixed therein objects of removal 14 and 15 is supplied to the first reservoir tank 70a by way of the pipe 72, and filtration of the fluid 73' is commenced.

Figure 5C:
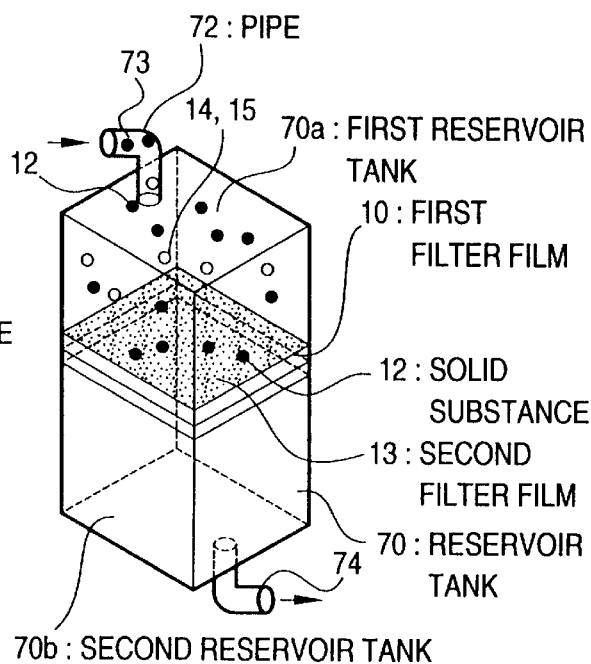
Figure 5B:
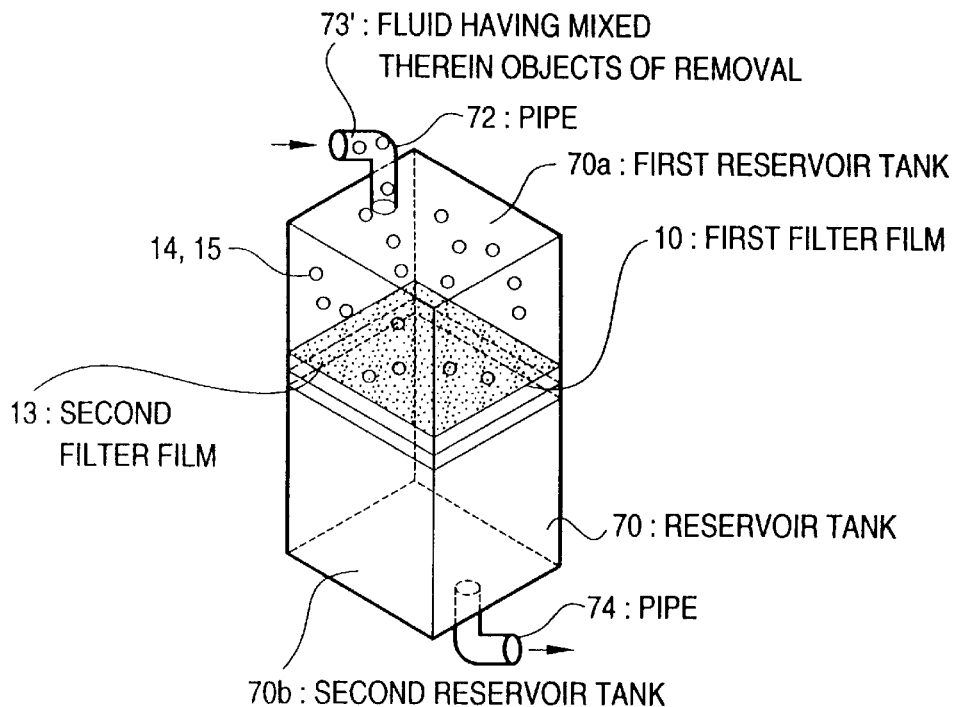
Figure 6A:
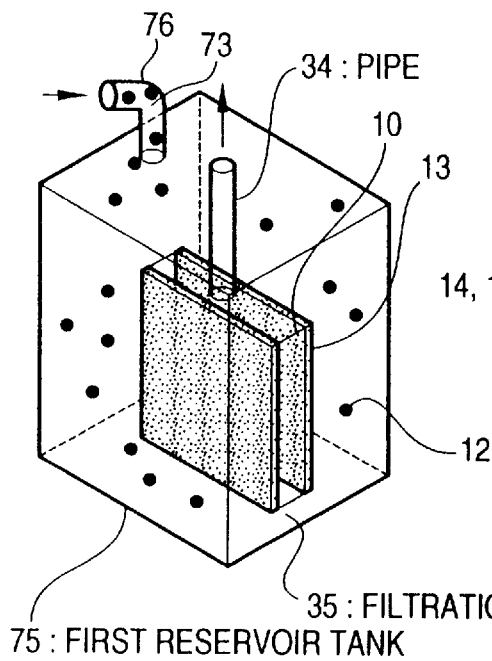
FIGS. 6A, 6A' and 6B are illustrations for describing a method of forming a second filter film on the first filter within a filtration unit.
Figure 6A:
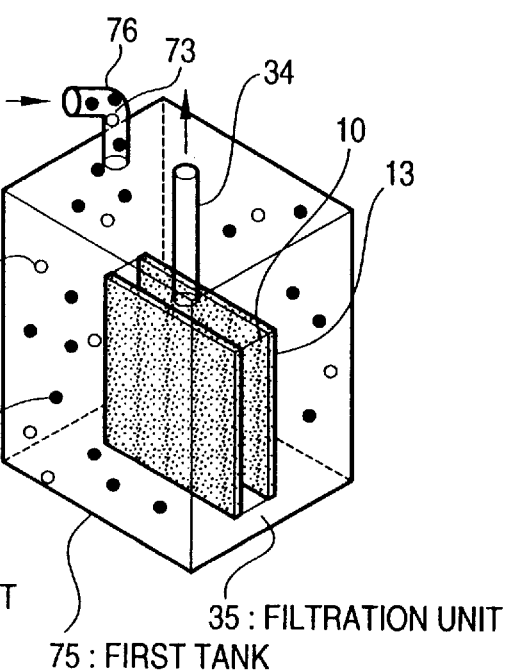
Figure 6B:
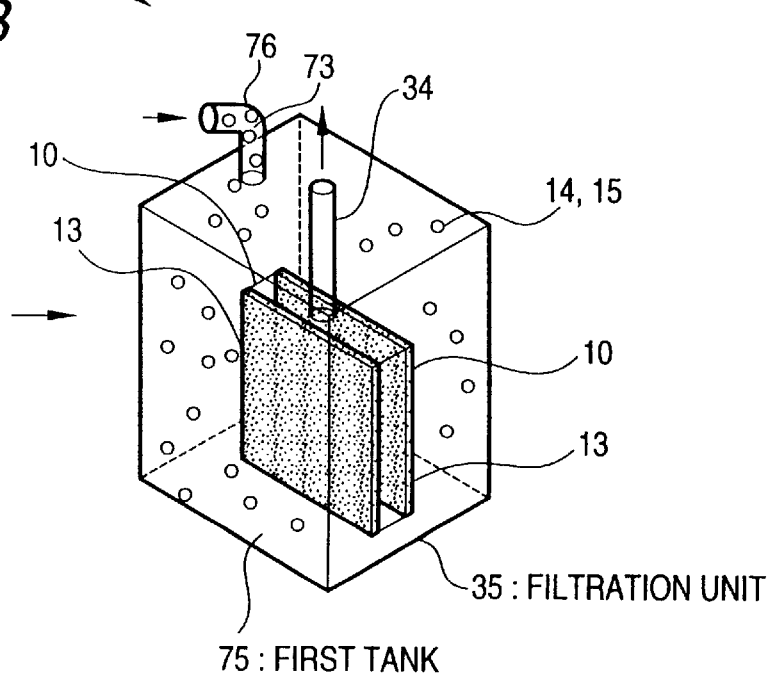

As shown in FIG. 5C, the fluid 73 stored in the first reservoir tank 70a has mixed therein the solid substances 12 and the objects of removal 14 and 15, and the second filter film 13 is formed from both the solid substances 12 and the objects of removal 14 and 15. In this case, the fluid 73 having mixed therein the objects of removal 14 and 15 and the solid substances 12 may be caused to flow from the pipe 72. Alternatively, a fluid having mixed therein the objects of removal 14 and 15 may be caused to flow from the pipe 72, and the solid substances 12 may be put into the first reservoir tank 70a from outside the reservoir tank 70. As shown in FIG. 5B, the fluid 73' having the objects of removal 14 and 15 mixed therein is supplied to the first reservoir tank 70a by way of the pipe 72, and filtration of the fluid 73' is commenced. Third and fourth methods constitute suctioning a fluid from the inside of a filtration unit 35 immersed in the fluid containing the solid substances 12, by way of a pipe 34, as shown in FIGS. 6A, 6A', and 6B. According to the third method, as shown in FIG. 6A, the fluid 73 having mixed therein the solid substances 12 (for example, dicing waste of silicon) is caused to flow into a first tank 75 by way of the pipe 76. When the filtration unit 35 equipped with the first filter film 10 is fully immersed in the fluid 73, the fluid 73 is suctioned by way of the pipe 34 attached to the filtration unit 35. As a result of a suction operation, the solid substances 12 are entrapped by the first filter film 10, thus constituting the second filter film 13. As shown in FIG. 6B, the fluid 73' having mixed therein the objects of removal 14 and 15 is supplied to the first tank 75 by way of a pipe 76. After entrapment of the objects of removal 14 and 15 by the second film 13 has been ascertained, filtration of the fluid 73' is carried out.

According to a fourth method, as shown in FIG. 6A', the fluid 73 stored in the first tank 75 has mixed therein the solid substances 12 and the objects of removal 14 and 15, and the second filter film 13 is formed from the solid substances 12 and the objects of removal 14 and 15. In this case, the fluid 73 having mixed therein the objects of removal 14 and 15 and the solid substances 12 may be caused to flow from the pipe 76. Alternatively, a fluid having mixed therein the objects of removal 14 and 15 may be caused to flow from the pipe 76, and the solid substances 12 may be put into the first tank 75 from the outside. As shown in FIG. 6B, the fluid 73' having mixed therein the objects of removal 14 and 15 is supplied to the first tank 75 by way of the pipe 76. After entrapment of the objects of removal 14 and 15 by the second filter film 13 has been ascertained, the fluid 73' having mixed therein the objects of removal 14 and 15 is filtrated.

Fifth and sixth methods falling under the latter method in which a filter film is formed in another tank will now be described by reference to FIGS. 7A to 8C. A filter containing solid substances or a filter containing both solid substances and objects of removal is prepared beforehand in another tank. The thus-prepared filter is moved to a tank into which a fluid containing objects of removal is to flow, and filtration of the objects of removal is performed.

As shown in FIG. 7A, according to the fifth method, the fluid 73 is caused to flow into the first reservoir tank 70a of the reservoir tank 70, and the fluid 73 is caused to migrate to the second reservoir tank 70b by force of gravity, application of pressure to the fluid 73 stored in the first reservoir tank 70a or suctioning of the fluid 73.

During migration, the solid substances 12 are entrapped by the first filter film 10, thus constituting the second filter film 13. After the second filter film 13 has grown to a predetermined thickness, the first and second filter films 10 and 13 are removed from the reservoir tank 70, to thereby prepare a filter, as shown in FIG. 7B. As shown in FIG. 7C, the thus-prepared two filters are bonded together, and the pipe 34 is led out from the space between the filters, thereby building the filtration unit 35. As shown in FIG. 7D, the filtration unit 35 is immersed in another tank 75, and suction is applied to the filtration unit 35 by way of the pipe 34, thus filtrating the fluid.

As shown in FIGS. 5A to 6B, according to the first through fourth methods, the second filter film 13 is formed in a wastewater tank, and hence filtration cannot be effected until the second filter 13 is formed. In contrast, according to the fifth method, since the filters have been prepared in advance, filtration can be effected immediately. Further, even when the location where the second filter 13 is prepared is disposed separately away from the tank into which wastewater is to be supplied, the second filter 13 can be readily carried.

In FIG. 7A, the objects of removal 14 and 15 may be mixed into the fluid 73 stored in the first reservoir tank 70, to thereby form the second filter 13 from the solid substances 12 and the objects of removal 14 and 15.

As shown in FIGS. 8A to 8C, according to the sixth method, the filtration unit 35 assembled by bonding together the first filter films 10 is immersed in the fluid containing the solid substances 12. The solid substances 12 are deposited on the first filter films 10, thus constituting the second filter films 13. As shown in FIG. 8A, a fluid containing only the solid substances 12 is caused to pass through the first filter films 10 attached to the filtration unit 35, thereby constituting the second filter films 13 over the respective first filter films 10 and preparing the filtration unit 35 in advance, as shown in FIG. 8B. As shown in FIG. 8C, the filtration unit 35 is immersed in a second tank 77, thus filtrating a fluid containing objects of removal.

The structure of the filtration unit 35 will be described in detail by reference to FIGS. 9A to 10D. The pipe 34 is inserted into the space between the first filters 10, and a suction pump (not shown) is connected to the pipe 34. A fluid is suctioned by way of the pipe 34, thereby forming the second filter films 13 over the respective first filter films 10.

As mentioned previously, the filtration unit 35 having the second filters 13 is prepared beforehand and can be readily carried to the second tank 77 disposed separately from the location where the filtration unit 35 is prepared. Further, filtration can be effected immediately without awaiting formation of the second filter films 13 within the second tank 77.

Under the method of forming a filter from solid substances, the method of forming a filter from solid substances and objects of removal, or the method of preparing a filtration unit through use of the filters formed according to either of these methods, the size of pores of the first filter film is set to fall within the grain size distribution of solid substances (i.e., dicing waste of silicon). For example, given that the size of pores is set to 0.25 µm, solid substances (i.e., dicing waste of silicon) and objects of removal (i.e., abrasive grains) which are smaller than 0.25 µm pass through the pores of the fist filter film. However, solid substances (i.e., dicing waste of silicon) and objects of removal (i.e., abrasive grains) which are larger than 0.25 µm are entrapped by the first filter film, and the second filter film 13 is formed, over the surface of the first filter 10, from the solid substances and/or objects of removal. As the second filter film 13 accumulates, solid substances and objects of removal which are smaller than 0.25 µm, particularly around 0.1 µm, can be gradually entrapped.

An example of the filtration unit 35 of a more desirable type will now be described by reference to FIGS. 9 and 10. This filtration unit 35 is to be immersed in a tank (raw water tank) and suction is applied thereto.

Figure 9A:
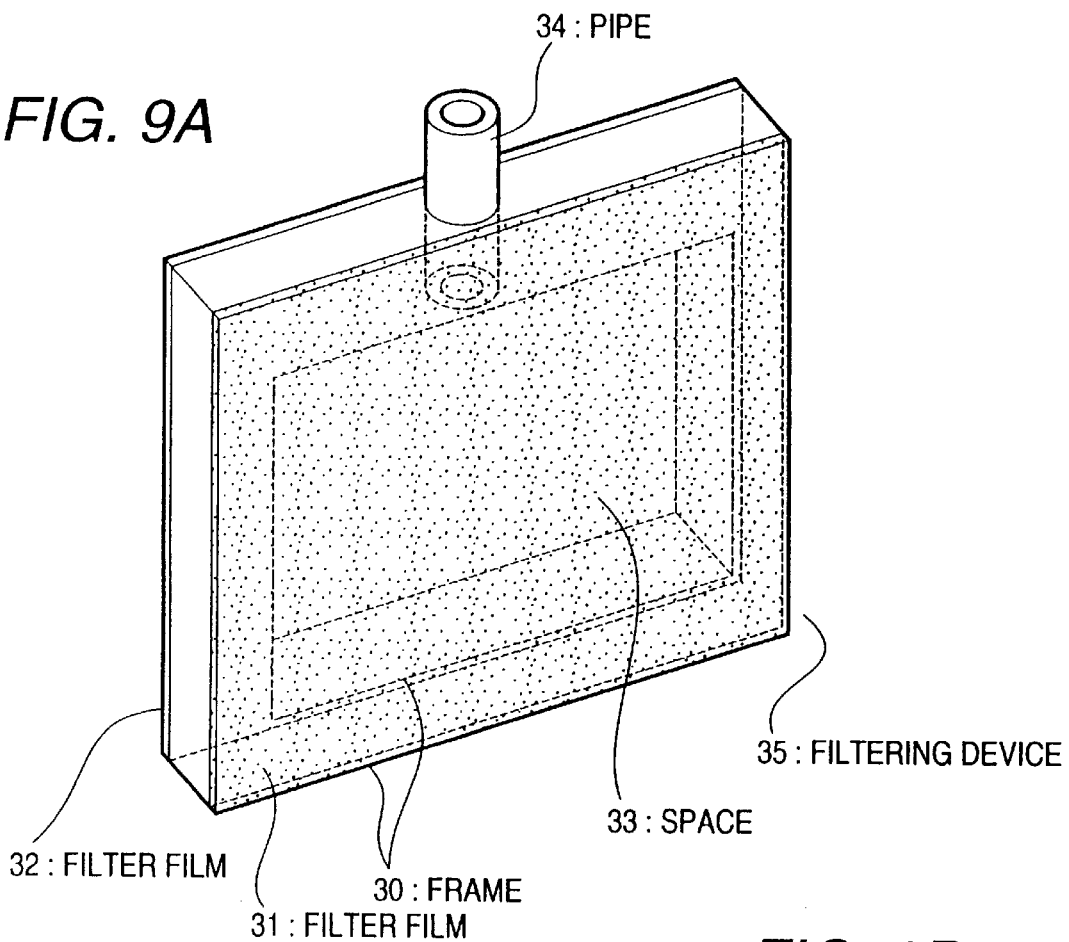
FIGS. 9A to 9C are illustrations for describing a filtration unit employed in the present invention.

Reference numeral 30 shown in FIG. 9A designates a frame such as a picture frame. A filter film 31 is affixed to one side of the frame 30, and a filter 32 is affixed to the other side of the frame 30. Suction is applied to the pipe 34 inserted in a space 33 defined by the frame 30 and the filter films 31 and 32, so that water filtrated through the filter films 31 and 32 is suctioned up by way of the pipe 34 attached to the frame 30 in a sealed manner. As a matter of course, the filter films 31 and 32 and the frame 30 are completely sealed so as to prevent wastewater from entering the space 33 from anywhere other than through the filter films 31 and 32.

Figure 9C:
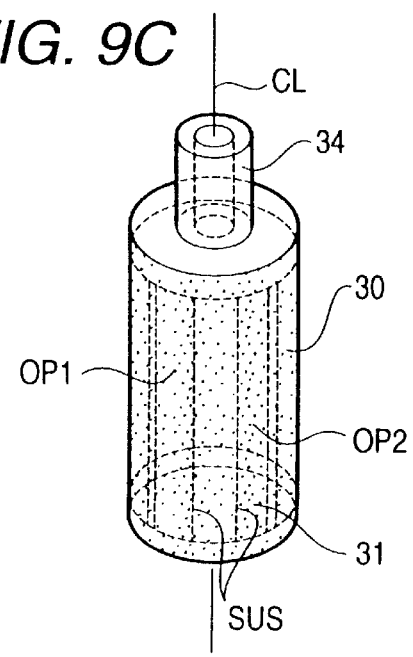
Figure 9B:
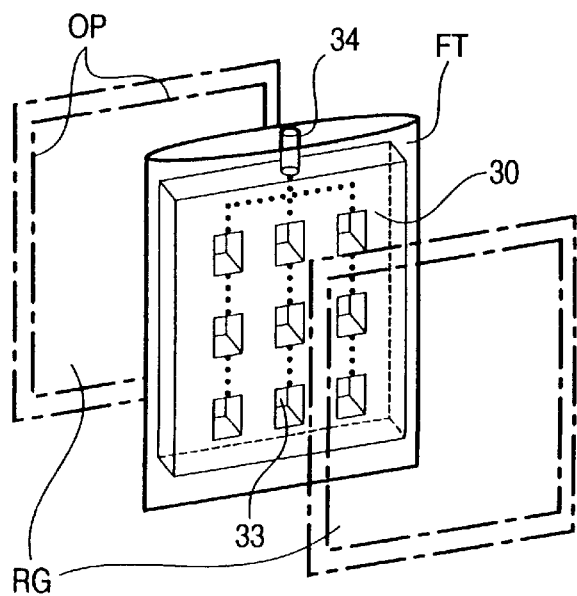

The filter films 31,32 shown in FIG. 9A is formed from a thin resin film. When suction is applied to the filter films 31, 32, the films 31,32 are deflected inwardly and may fracture. To prevent such deflection or fracture, the space 33 must be made as small as possible. In contrast, there is a necessity for forming a large number of spaces 33 in order to increase the filtration capacity of the filtration unit 35. An improved filtration unit 35 is shown in FIG. 9B. Although nine spaces 33 are shown in FIG. 9B, a larger number of spaces 33 may be actually formed in the filtration unit 35. The filter films 31 and 32 actually employed in the improved filtration unit 35 are formed from a polyolefine-based macromolecular film. As shown in FIG. 9B, the thin filter films 31 and 32 are formed to be continuous and to assume the form of a bag. In FIG. 9B, the bag-shaped filter is designated by FT. The frame 30 to which the pipe 34 is integrally attached is inserted into the filter FT, and the filter FT is affixed to the frame 30. The frame 30 having the filter films 31 and 32 affixed thereto is pressed from both sides by pressing means RG. The filter films 31 and 32 are exposed by way of respective openings OP of the pressure means RG. FIG. 9C shows the filtration unit 35 formed into a cylindrical shape. The frame 30 attached to the pipe 34 assumes a cylindrical shape, and openings OP1 and OP2 are formed in the side surface of the frame 30. The areas of the side surface of the frame 30 corresponding to the openings OP1 and OP2 are removed, and hence support means SUS for supporting the filter film 31 is provided between the openings OP1 and OP2. The filter film 31 is affixed to the side surface of the support means SUS.

The thus-improved filtration unit 35 will be described in detail by reference to FIGS. 10A–D. The frame 30 shown in FIG. 9B corresponds to a frame 30a shown in FIG. 10B.

The frame 30a has a structure analogous to that of corrugated cardboard; specifically, a plurality of partitions are interposed between to thin plates so as to extend in a transverse direction of the thin plate, thus constituting a plurality of small chambers. A plurality of holes HL are formed in the thin plates, and water can pass through the chambers by way of the holes HL. More specifically, resin sheets SHT1 and SHT2, each being as thin as 0.2 mm or thereabouts, are attached together, to thereby constitute a plurality of sections SC extending in the transverse direction of the sheets SHT1 and SHT2. Spaces 33 are defined by the resin sheets SHT1 and SHT2 and the sections SC. The space 33 has a rectangular cross section and measures 3 mm long and 4 mm wide. Put another way, straws, each having a rectangular cross section, are integrally arranged in a row. The frame 30a sustains a predetermined interval between the filter films FT (each FT comprising filter films FT1 and FT2) and will be hereinafter referred to as a "spacer."

Numerous holes HL, each having a diameter of 1 mm, are formed in the surfaces of the thin resin sheets SHT1 and SHT2 of the spacer 30a and the filter film FT is affixed to the surface of the thin resin sheet SHT1 and the surface of the thin resin sheet SHT2. The water filtrated through the filter films FT is finally drawn out by way of the pipe 34, by way of the holes HL and the spaces 33.

The filter film FT is affixed to each of the resin sheets SHT1 and SHT2 provided on respective sides of the space 30a. At some locations on the sheets SHT1 and SHT2, no holes HL are formed. If the filter film FT1 is directly affixed to such locations, the portions of the filter film FT1 corresponding to the locations where no holes HL are formed fail to perform filtration. Since no wastewater passes through such portions, objects of removal are not entrapped by the portions of the filter film FT1. To prevent such a phenomenon, at least two filter films FT are affixed to each side of the spacer 30a. The outermost filter film FT1 is for entrapping objects of removal. Another filter film having pores larger than those of the filter film FT1 is interposed between the filter film FT1 and the surface SHT1 of the spacer 30a; specifically, in the present example the filter film FT2 is interposed. The filter film FT2 is brought in contact with the portions of the spacer 30a where no holes HL are formed, and hence the entire filter film FT1 performs filtration. Accordingly, objects of removal are entrapped by the entire filter film FT1, whereby the second filter film is formed over each of the sheets SHT1 and SHT2 of the spacer 30a. For convenience of explanation, the filter films FT1 and FT2 are formed into rectangular sheets. In practice, as shown in FIG. 9B, the filter films FT1 and FT2 are formed into bag-shaped filter films.

The way in which the bag-shaped filter films FT1 and FT2, the spacer 30a and the pressing means RG are assembled will now be described by reference to FIGS. 10A, 10C and 10D.

Figure 10A:
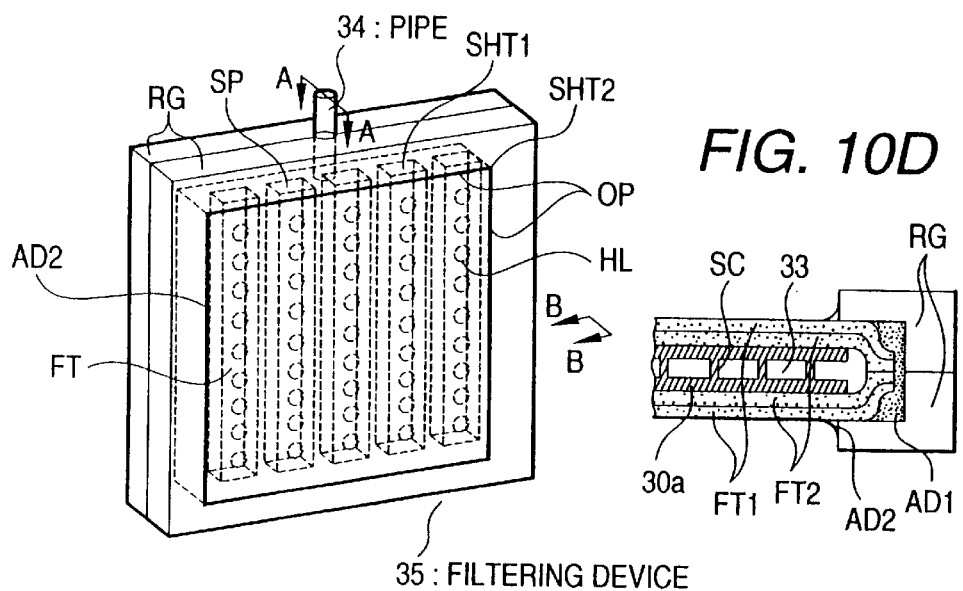
FIGS. 10A to 10D are illustrations for describing a filtration unit employed in the present invention.

FIG. 10A is an as-built drawing; FIG. 10C is a cross-sectional view taken along line A—A from the top of the pipe 34 to the bottom thereof (i.e., in a longitudinal direction); and FIG. 10D is a partial cross-sectional view of the filtration unit 35 taken along line B—B (i.e., in the horizontal direction).

Figure 10D:
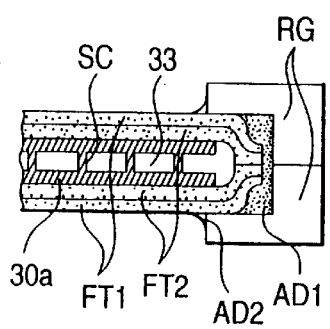
Figure 10C:
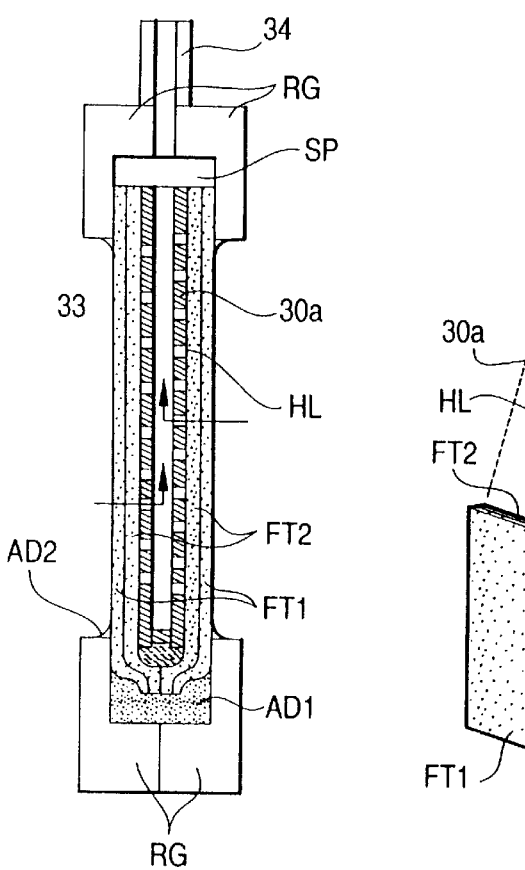
Figure 10B:
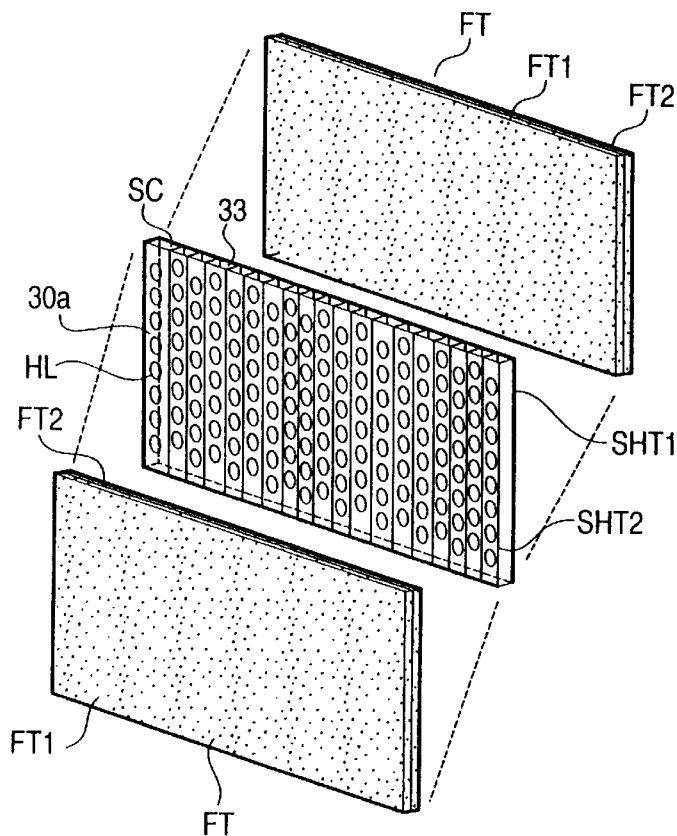

As is evident from FIGS. 10A, 10C, and 10D, the four sides of the spacer 30a inserted in the bag-shaped filter film FT are pressed in conjunction with the filter film FT by the pressing means RG. Three sides of the bag-shaped filter film FT are fixed to the corresponding pressing means RG by means of an adhesive AD1, and a space SP is formed between the remaining side (i.e., an opening of the bag-shaped filter film FT) and the corresponding pressing means RG. Filtrated water originating in the spaces 33 is suctioned to the pipe 34 by way of the space SP. An adhesive AD2 is applied a gap between the entire inner periphery of an opening OP of the pressing means (hardware) RG and the area of the filter film FT exposed through the opening OP, thus forming a complete seal. In this way, a fluid cannot enter the filtration unit 35 from anywhere other than through the filter films FT.

Figure 11:
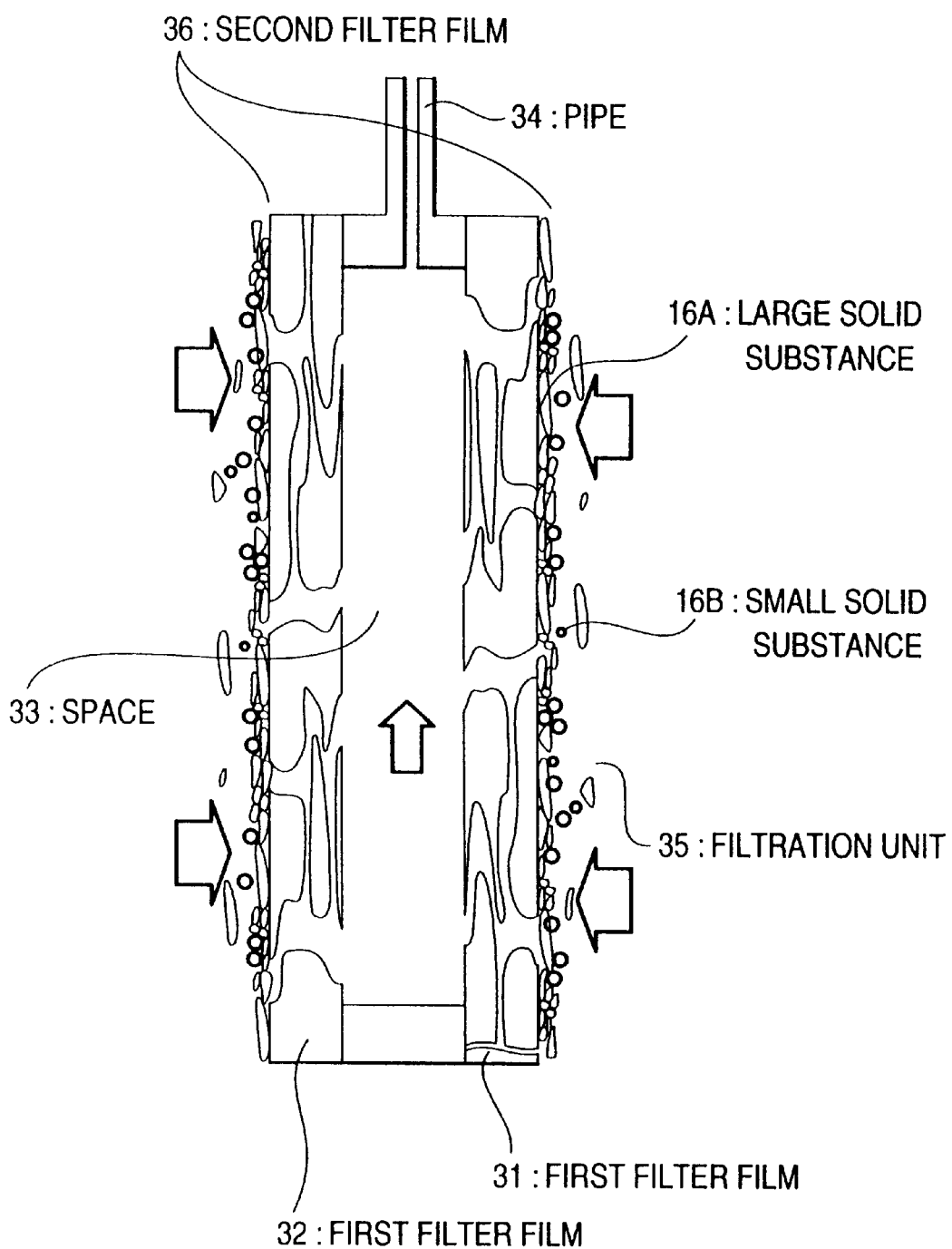
FIG. 11 is an illustration for describing the filtrating operation of the filtration unit shown in FIGS. 9A to 10D.

The spaces 33 and the pipe 34 are in communication with each other. When suction is applied to the pipe 34, a fluid flows toward the spaces 33 by way of the pores of the filter films FT and the holes HL of the spacer 30a and by way of the pipe 34 filtrated water can be transported from the spaces 33 to the outside of the filtration unit 35. The operation of the thus-embodied filtration unit 35 is conceptually represented in FIG. 11. Suction is applied to the pipe 34, and wastewater flows in the direction designated by outlined arrows and is subjected to filtration.

The filtration unit 35 is immersed in a tank in which the fluid having mixed therein solid substances 16 is stored, and the fluid is suctioned by way of the pipe 34 and flows in the direction designated by outline arrows. Small substances 16B pass through the filtration unit 35, whereas large solid substances 16A are entrapped by the first filters 31 and 32, and the small solid substances 16B gradually become entrapped by the first filter films 31 and 32. When the concentration of the solid substances 16 in the fluid becomes lower than a predetermined value, formation of a second filter film 36 is considered completed.

Figure 12:
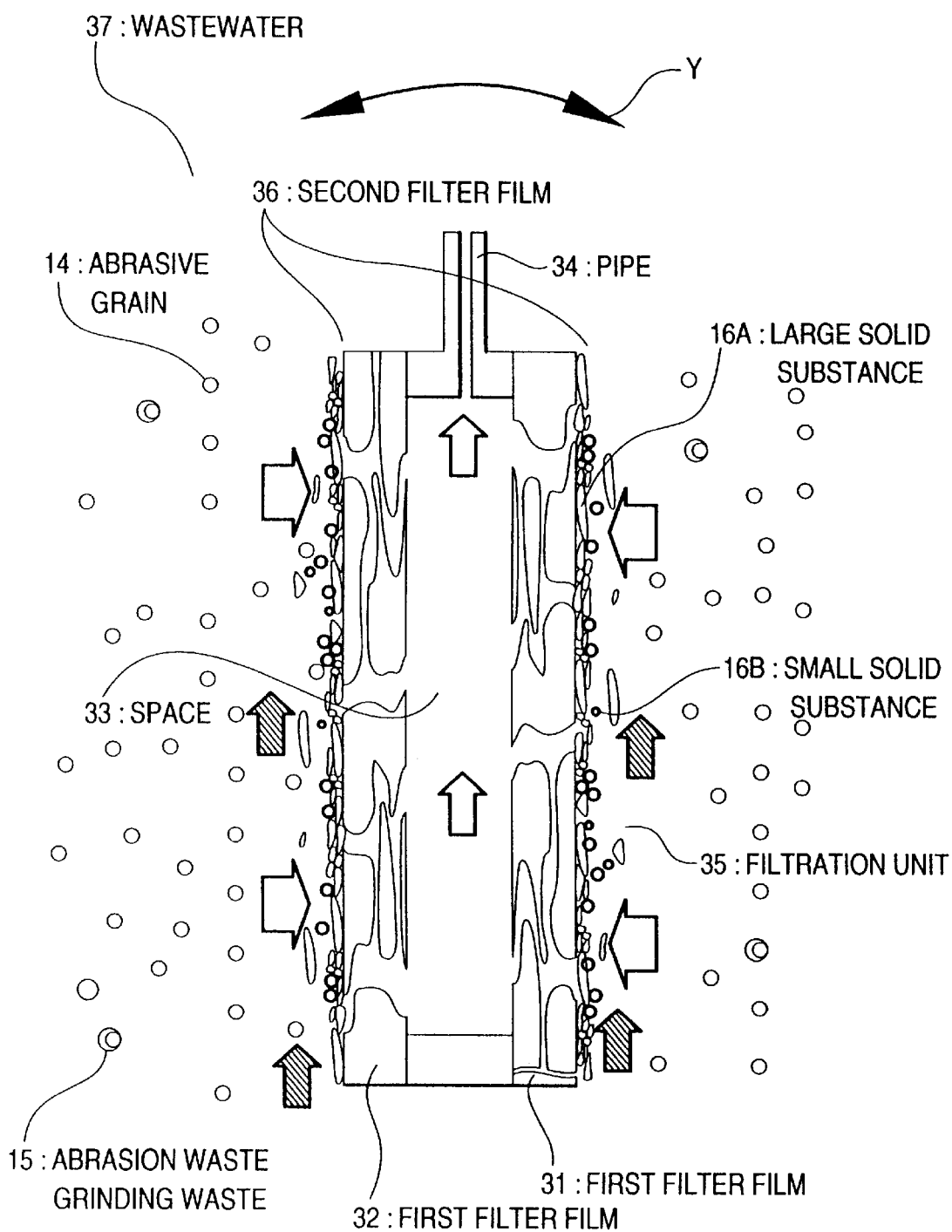
FIG. 12 is an illustration for describing the filtrating operation of the filtration unit shown in FIGS. 9A to 10D.

As shown in FIG. 12, the filtration unit 35 on which the second filter film 36 is formed is immersed in wastewater 37 having mixed therein objects of removal. Objects of removal are entrapped by the second filter film 36 by application of suction to the pipe 34. Since the second filter film 36 is formed from a cluster of the solid substances 16, removal of the second filter film 36 or removal of a surface layer of the second filter film 36 can be performed by application of external force to the second filter film 36. Further, the abrasive grains 14 and the objects of removal of abrasion (i.e., objects of removal to be abraded) 15 are also formed from a cluster of solid substances. Therefore, the abrasive grains 14 and the objects of removal 15 can be readily separated from the second filter film 36 and moved toward wastewater 37, by application of external force to the abrasive grains 14 and the objects of removal 15.

The abrasive grains 14 and the objects of removal of abrasion 15 can be readily moved or separated from the second filter film 36 by utilization of ascending force of air bubbles, by application of a water stream, sound waves, ultrasonic vibration, or mechanical vibration to the surface of the second filter film 36, by scrubbing the surface of the second filter film 36 through use of a squeegee, or by use of an agitator. Alternatively, the filtration unit 35 to be immersed is formed so as to be able to tilt within wastewater (i.e., raw water), to thereby produce a water stream on the surface layer of the second filter film 36 so as to eliminate the second filter film 36 or the objects of removal 14 and 15. For example, as shown in FIG. 12, the filtration unit 35 may be tilted rightward and leftward in the direction designated by arrow Y while the bottom of the filtration unit 35 is taken as a fulcrum. In this case, since the filtration unit 35 per se is movable, a water stream is generated, thereby removing a surface layer from the second filter film 36. In a case where an air-bubble generator 54 to be described later is adopted along with the filtration unit 35, air bubbles can be brought into contact with the entire filtration surface of the filtration unit 35, so long as the filtration unit 35 employs the previously-described tiltable structure, thereby efficiently moving the objects of removal toward the wastewater 37.

In a case where the cylindrical filtration unit 35 shown in FIG. 9C is employed, the filtration unit 35 can be rotated about a center line CL, to thereby diminish the resistance of wastewater to a much greater extent than in a case where a plate-shaped filter shown in FIG. 12 is tilted rightward and leftward. Rotation of the filtration unit 35 causes a water stream over the filter film, thereby causing the objects of removal accumulated on the surface of the second filter film to migrate toward the wastewater. Accordingly, the filtration capability of the filtration unit 35 can be sustained. Rotation of the filtration unit 35 may be performed at all times or intermittently.

FIG. 12 shows a method of eliminating a surface layer from the second filter film by utilization of the ascending force of air bubbles. Air bubbles ascend in the direction designated by the hatched arrows, and the ascending force of air bubbles and rupturing of air bubbles exert external force directly to objects of removal and solid substances. Further, the ascending force of air bubbles or a water stream resulting from rupturing of air bubbles impart external force to objects of removal and solid substances. The external force enables constant refreshing of filtration capability of the second filter film 36 and sustains the filtration capability at a substantially constant level.

The characteristic feature of the present invention resides in sustaining of filtration capability of the filtration unit. Even if the filtration capability of the second filter film 36 is deteriorated by clogging, external force is applied, by way of air bubbles, to the solid substances 16 and the objects of removal 14 and 15, which constitute the second filter film 36. As a result, the solid substances 16 and the objects of removal 14 and 15 can be caused to migrate toward the wastewater 37, thereby enabling the filtration capability of the filtration unit 35 to be sustained over a long period of time.

The thickness of the second filter film 36 is considered to be maintained substantially uniform by application of external force to the second filter film 36. Filtration performed by the filtration unit 35 resembles that which would be achieved if individual objects of removal were to plug inlets for the wastewater 37 and the wastewater 37 was to enter the inside of the filtration unit 35 by way of the inlets from which the objects of removal have been removed. If the inlets were plugged again, the inlets would be opened by means of external force. Through repetition of these actions, the wastewater is purified in the purification unit 35. Further, the filtration capability of the filtration unit 35 can be sustained constant by control of the size and quantity of air bubbles and the time during which air bubbles are applied to the filtration unit 35.

So long as the filtration capability of the filtration unit can be sustained, external force may be applied to the filtration unit 35 constantly or intermittently.

The feature common to all the embodiments is that the filter film must be fully immersed in raw water. Upon exposure to air for a prolonged period of time, the second filter film becomes dried and is scrubbed or crumbled. When even a small portion of the filter film is exposed to air, the filter film absorbs air, whereby the filtration capability of the filter film 2 is deteriorated.

As mentioned previously, in view of the underlying principle of the present invention, so long as the second filter film 36 is formed on the first filter films 31 and 32, the first filter films 31 and 32 may be formed from a sheet-like macromolecular film or a ceramic sheet and may be of suction type or pressure type. From a practical standpoint, the first filter films 31 and 32 are preferably formed from a suction-type macromolecular film. The reason for this will be explained below.

Figure 13:
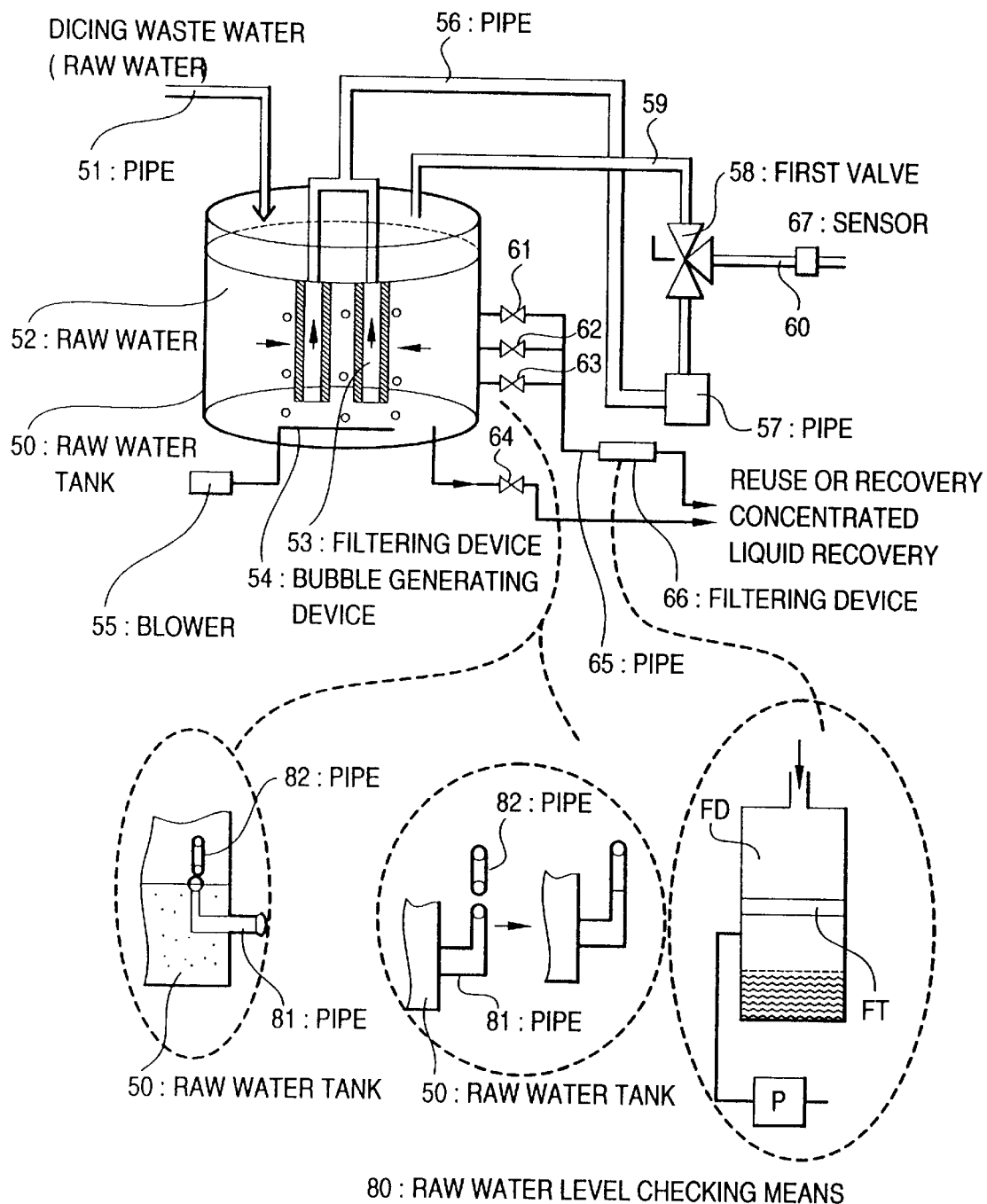
FIG. 13 is an illustration of a system for describing a filtration method according to the present invention.

Forming a sheet-like ceramic filter increases cost considerably. In the event that cracks arise in the filter, leakage of wastewater will occur, thus hindering filtration. In the case of a pressure-type filter film, waste water must be pressurized. If a raw-water tank 50 shown in FIG. 13 is taken as an example, the upper portion of the raw-water tank 50 must be sealed rather than opened, in order to apply pressure to the fluid stored in the tank. However, if the tank is sealed, generation of air bubbles becomes difficult. In the case of a macromolecular film, sheets or bag-shaped filters of various sizes are inexpensively available. Since the macromolecular sheet is flexible, cracks are unlikely to arise in the film, and irregularities can be readily formed in the surface of the sheet. By means of the irregularities formed in the sheet, the second filter film is engaged with the sheet, thus preventing exfoliation of the second filter film from the sheet within wastewater. Further, if the sheet is of suction type, the tank may be of open type.

If the second filter film is of pressure type, formation of the second filter film is difficult. In connection with FIG. 12, provided that the pressure in the space 33 is one, pressures greater than one must be applied to the wastewater 37. Accordingly, it is thought that a load is applied to the filter films 31 and 32 and that the objects of removal entrapped by the filter films 31 and 32 remain stationary under high pressure, thus making migration of objects of removal difficult. An example of a suction-type mechanism—in which the previously-described macromolecular film is adopted as a filter film—will be described by reference to FIG. 13. Even in the case of this mechanism, three methods of forming the second filter film are available.

According to a first method, a filtration unit 53 having mounted thereon a fist filter film is immersed in the raw-water tank 50, and solid substances have been mixed into a fluid stored in the raw-water tank 50 in advance. The second filter film is formed by application of suction to a pipe 56. After completion of the second filter film, wastewater having mixed therein objects of removal is supplied to the raw-water tank 50 by way of a pipe 51, and filtration of the wastewater is commenced.

According to a second method, the filtration unit 53 having mounted thereon the first filter film is immersed in the raw-water tank 50. Solid substances and objects of removal have been mixed into the wastewater stored in the raw-water tank 50 beforehand. A second filter film is formed by application of suction to the pipe 56. After formation of the second filter film, the wastewater having mixed therein objects of removal is supplied to the raw-water tank 50 by way of the pipe 51, and filtration of the wastewater is commenced.

According to a third method, first and second filter films are formed on the filtration unit 53 in another tank, and the thus-prepared filtration unit 53 is disposed in the raw-water tank 50. Wastewater having mixed therein objects of removal is supplied to the raw-water tank 50 by way of the pipe 51. After the filtration unit 53 has been completely immersed in the wastewater, filtration is commenced.

In this example, dicing waste is used as solid substances for constituting a second filter film.

Reference numeral 50 shown in FIG. 13 designates the raw-water tank. The pipe 51 is disposed above the tank 50 as wastewater supply means and is used for supplying a fluid having mixed therein objects of removal. An application to the semiconductor industry is taken as an example. In this case, wastewater (i.e., raw water) which has mixed therein objects of removal and is drawn from a dicing machine, a back-grinding machine, a mirror-polishing machine, or a CMP machine passes through the pipe 51. In the following description, the wastewater corresponds to wastewater in which are mixed abrasive grains drawn from a CMP machine and grinding or abrasion waste originating from abrasive grains.

A plurality of filter units 53, each having a second filter film mounted thereon, are disposed in raw water 52 stored in the raw-water tank 50. A bubble generator 54, such as a bubbling device which is made by opening small holes in a pipe and is designed for use in an aquarium, is disposed below the filtration units 53. The bubble generator 54 is positioned such that air bubbles pass by the surface of the second filter film. Reference numeral 55 designates an air blower.

The pipe 56 attached to the filtration unit 53 corresponds to the pipe 34 shown in FIG. 12. A fluid filtrated through the filtration unit 53 flows through the pipe 56 and is selectively transported to either back to the raw-water tank 50 via a first valve 58 and a pipe 59 connected to the raw-water tank 50, or to a recycling section (or an outlet section) via the first valve 58 and a pipe 60. A second valve 61, a third valve 62, and a fourth valve 63 are mounted on the side wall of the raw-water tank 50, and a fifth valve 64 is mounted on the bottom of the raw-water tank 50. Another filtration device 66 is provided at any position within a pipe 65.

The raw water 52 supplied from the pipe 51 is stored in the raw-water tank 50 and is filtrated by the filtration unit 53. Air bubbles pass by the surface of the filter film attached to the filtration unit 53, and objects of removal entrapped by the filter film are moved by means of the ascending force and rupturing of air bubbles, thus preventing deterioration in the filtration capability of the filter film and sustaining the filtration capability thereof at all times.

In a case where a filtration unit having a second filter film is newly disposed in the raw-water tank 50, where the filtration system remains in a nonoperational state for a long period of time during holidays, or where objects of removal are present in the pipe 59 at a concentration greater than a predetermined value, the filtration system is designed to circulate the fluid to the raw-water tank 50 by way of the pipe 59 and the valve 58. At all other times, the valve 58 is switched to the pipe 60, to thereby recycle a filtrated fluid or transport the filtrated fluid to a wastewater treatment section.

In a case where the filtration unit 53 having a second filter film mounted thereon is newly disposed in the raw-water tank 50, a fluid is circulated for about one hour, although the time may differ according to the size of the filter film 2 and the rate at which a fluid is suctioned. Even if a portion of the second filter film is crumbled, the second filter film will collect itself within one hour and becomes able to entrap silicon waste of 0.1 $\mu$m or less. It is also found that, in the case of a filter film of small size, the filter film may collect itself within half an hour. So long as the circulation time is known, the first valve 58 may be automatically switched through use of a timer after lapse of a predetermined period of time.

The filtration unit 53 employs a structure as shown in FIG. 10, and a frame to which a filter film is affixed measures about 100 cm high, about 50 cm wide, and 5 to 10 mm deep.

In a case where objects of removal are present at a concentration higher than a predetermined value, the fluid is determined to be anomalous, and circulation of the fluid is automatically commenced, or the pump 57 is stopped so as to suspend a filtration operation. At the time of circulation of a fluid, supply of a fluid to the tank 50 by way of the pipe 51 may be suspended in consideration of a possibility of overflow of wastewater from the tank 50. Such a scenario will be briefly described hereinbelow.

A first scenario corresponds to a case where the filtration unit 53 is newly disposed in the raw-water tank 50.

The second filter film of the filtration unit 35 may be ruptured during a transport process. Therefore, before processing relating to a filtration process is commenced, the ruptured portion of the second filter film is repaired by circulation of the fluid through use of the filtration unit, to thereby cause the filter film to entrap objects of removal. The second filter film is caused to grow until objects of removal of target grain size are entrapped by the second filter film (i.e., the concentration of objects of removal has achieved a first predetermined value). After the first predetermined mixture proportion has been achieved, the fluid is transported to the pipe 60 by way of the first valve 58.

A second scenario corresponds to a case where filtration is resumed after the filtration system has remained in a nonoperational state for reasons of; e.g., off-days, a vacation, or maintenance.

The second filter film is formed from objects of removal and is present in wastewater. If filtration is suspended for a long period of time, a portion of the surface layer of the second filter film may be crumbled. Circulation of a fluid is performed in order to repair the crumbled portion of the second filter film. In the test, the second filter film firmly adheres to the first filter film, and the surface of the second filter film is covered with objects of removal, and hence the second filter film is hardly susceptible to rupture. However, in the present example, circulation of a fluid is effected for added safety. When the concentration of objects of removal has achieved the first predetermined value, the first valve 58 is switched to the pipe 60. Air bubbles may not be generated before the first predetermined value is achieved and filtration is commenced.

A third scenario corresponds to a case where objects of removal to be entrapped are present in the fluid.

In the event that a portion of the second filter film is crumbled or the second filter film is ruptured, objects of removal are mixed into the fluid at high concentration.

In the event that a portion of the second filter film is crumbled and objects of removal are present in concentration higher than a predetermined concentration (i.e., a second predetermined value), the fluid is circulated by means of the first valve 58 by way of the pipe 59, and a filtration operation is effectively suspended. The circulation of the fluid is resumed, to thereby repair the second filter film. When the objects of removal are present in the fluid at the predetermined concentration (i.e., the first predetermined value), the first valve 58 is switched to the pipe 60. Air bubbles can be able to be not generated before the first predetermined value is achieved and a filtration operation is commenced.

In the event that the first filter film is ruptured, the first filter film must be replaced with another one or the filtration unit 53 must be replaced with another unit. In the filtration unit 53, the filter film 1 is integrally attached to the filtration unit 53 by the adhesives AD1 and AD2, and hence replacement of only the first filter film is impossible. Therefore, the filtration unit 53 is replaced with another filtration unit 53 having a second filter film formed thereon. In this case, a check is made as to whether or not the second filter film of the new filtration unit 53 can entrap predetermined objects of removal. If the second filter film cannot entrap predetermined objects of removal, the filtration capability of the second filtration film is improved by means of circulation. In contrast, if it is ascertained that the second filtration film can entrap predetermined objects of removal, the first valve 58 is switched to the pipe 60.

A fourth scenario corresponds to a case where the level of wastewater in the raw-water tank 50 is lowered and the filter film is exposed to the atmosphere.

Figure 15:
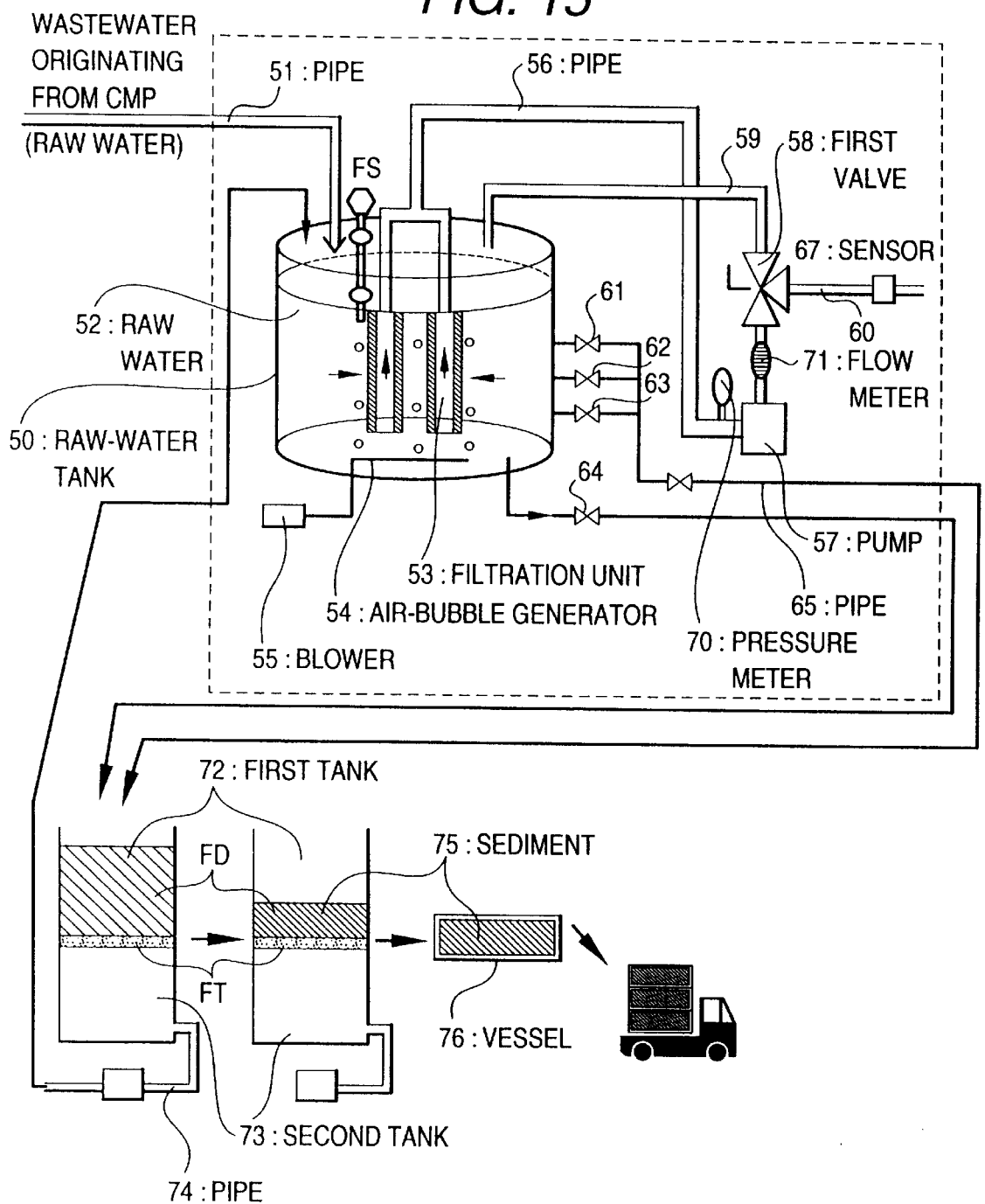
FIG. 15 is an illustration of a system for describing a filtration method according to the present invention.

Before the filter film is exposed to the atmosphere, filtration is suspended through use of a level sensor disposed in wastewater (designated by reference symbol FS shown in FIG. 15). At this time, generation of air bubbles can be also suspended. Since wastewater is supplied from the pipe 51, a turbulent flow is induced by air bubbles, thus resulting in a possibility of crumbling of the second filter film. When the wastewater has reached a predetermined wastewater level at which filtration is enabled, circulation is resumed. During circulation of a fluid, objects of removal are detected. When the objects of removal are present in the fluid at a predetermined concentration (i.e., the first predetermined value), the first valve 58 is switched to the pipe 60.

The first and second predetermined values, which represent the concentration of objects of removal in the fluid, may assume the same value. Alternatively, the second predetermined value may be set to be greater than the first predetermined value within a certain range.

A sensor 67 senses solid substances and objects of removal at all times. Optical sensors, which are formed from a light-emitting element and a light-receiving element, are used as the sensor 67 and are disposed such that the fluid is interposed between the light-emitting element and the light-receiving element. Preferably, light emitted from a light-emitting element is received by a light-receiving element. A ratio between the energy of the emitted light and the energy of the received light is measured, thus enabling measurement of concentration of the solid substance and the objects of removal in the fluid at all times. Thus, the state of the filtration capability of the filter film can be detected. A light-emitting diode or a laser diode is conceivably employed as the light-emitting element. Further, the sensor 67 may be provided at any position within the pipe 56 or 59.

The manner of filtrating the wastewater which flows from a CMP machine and contains objects of removal mixed therein will now be described.

FIGS. 14A and 14B show the grain size distribution of abrasive grains included in a slurry for use with a CMP machine. The abrasive grains are for subjecting to CMP treatment an interlayer dielectric film made of silicon oxide. The abrasive grains are formed from silicon oxide and are generally called silica. The smallest abrasive grain has a diameter of about 0.076 $\mu$m, and the largest abrasive grain has a diameter of about 0.34 $\mu$m. The large grain corresponds to a coagulated grain consisting of a plurality of smaller grains. A mean grain size is about 0.1448 $\mu$m. The grain size distribution shows a peak in the vicinity of 0.13 to 0.15 $\mu$m. KOH or NH3 is commonly used as a slurry regulator. Further, the slurry assumes a pH between 10 to 11 or thereabouts.

FIG. 14C shows data representing filtration of wastewater discharged from a CMP machine and capture of abrasive grains. In a test, a stock solution of slurry was diluted 50 fold, 500 fold, and 5000 fold with pure water, thus preparing three types of test solution. As described in connection with the example of the existing filtration system, the three types of test solution were prepared on the assumption that wastewater is diluted about 50 to 5000 fold with pure water during a CMP process in which a wafer is cleaned with pure water. The thus-prepared three types of test solution were put into the raw-water tank 50 shown in FIG. 13 and purified through the filtration unit 53.

Examination of transmissivity of light of 400 nm in the test solutions before filtration shows that the transmissivity of light in the 50-fold diluted test solution is 22.5%; the transmissivity of light in the 500-fold diluted test solution was 86.5%; and the transmissivity of light in the 5000-fold diluted test solution was 98.3%. Since abrasive grains are contained in the wastewater, light is scattered. It is understood that the higher the concentration of abrasive grains, the lower the transmissivity of light.

After filtration of the test solution, all three types of test solution show a transmissivity of 99.8%. Since the transmissivity of the test solution after filtration is greater than that obtained before filtration, it is found that abrasive grains were entrapped by the filtration unit. Here, data pertaining to the transmissivity of the 50-fold diluted test solution assume a small value, and hence the data are omitted from the graph shown in FIG. 14C.

As can be seen from the foregoing description, it is found that, in a case where the objects of removal discharged from a CMP machine are filtrated through a filter having the second filter film formed from the solid substances 16A and 16B, the objects o f removal can be filtrated until a transmissivity of about 99.8% is achieved.

Solid substances constituting the second filter film may be mechanically produced by means of abrasion, grinding, or pulverization or may be collected from the world of nature. Further, the grain size distribution of the solid substances preferably has a distribution such as that shown in FIG. 2. Particularly, the grain size distribution shows a first peak at a size of 1 $\mu$m or less and a second peak at a size of 20 to 50 $\mu$m. Preferably, small solid substances in the vicinity of the first peak are present in smaller proportion than are large solid substances in the vicinity of the second peak.

Objects of removal may be mixed into wastewater at a grain size distribution obtained as a result of the objects of removal being produced by processing and may be filtrated. Alternatively, other grains may be added to the wastewater so that the overall grain size distribution of the wastewater containing the objects of removal and the thus-added grains becomes equal to or similar to the distribution shown in FIG. 2. For example, the objects of removal contained in the wastewater discharged from a CMP machine show a peak in the vicinity of about 0.1 μm and are distributed within a narrow range of less than 1 μm centered on the peak. Fine particles having a grain size distribution ranging from about 1 μm to about 200 μm shown in FIG. 2 (for example, dicing waste) may be mixed into the wastewater discharged from a CMP machine. As a result, a film which is formed as a result of solid substances being entrapped by the second filter film has the same size apertures as those formed in the second filter film, thereby sustaining the ability of the filter film to capture objects of removal and sustain transmissivity of light within a fluid.

Abrasive grains for use in a CMP operation are essentially classified into silica-based abrasive grains, alumina-based abrasive grains, cerium-oxide-based abrasive grains, and diamond-based grains. Moreover, the abrasive grains are classified into chromium-oxide-based abrasive grains, iron-oxide-based abrasive grains, manganese-dioxide-based abrasive grains, $BaCO_4$-based abrasive grains, antimony-oxide-based abrasive grains, zirconia-based abrasive grains, and yttria-based abrasive grains. Silica-based abrasive grains are used for smoothing an interlayer dielectric film of a semiconductor, P—Si, SOI, or a glass disk. Alumina-based abrasive grains are used for polishing a hard disk or smoothing any type of metal or a silicon oxide film. Cerium-oxide-based abrasive grains are used for polishing glass or silicon oxide. Chromium-oxide-based abrasive grains are used for mirror-polishing of steel, and manganese-dioxide-based abrasive grains or $BaCO_4$ is used for polishing a tungsten wire.

Further, abrasive grains called oxide sol may be used. In this oxide sol, a metal oxide, such as silica, alumina, zirconia or fine particles of colloid size partially formed from hydroxide, are uniformly dispersed into water or a fluid. The oxide sol is used for smoothing an interlayer dielectric film of a semiconductor device or metal. Further, application of oxide sol to polishing of a data disk, such as an alumina disk, is under study.

These abrasive grains are the same in size as those shown in FIGS. 14A and 14B. Needless to say, wastewater in which these abrasive grains are mixed can be filtrated, and the abrasive grains can be entrapped.

Next will be described disposal of the wastewater whose object of removal-of-removal content (hereinafter called "object of removal content" or simply "concentration") is increased through filtration. In the raw-water tank 50 shown in FIG. 13, object of removal content is increased with lapse of time. When a desired object of removal content is achieved, a filtration operation is suspended, to thereby induce coagulation and sedimentation of raw water and leave the raw water. In due time, the raw water stored in the raw-water tank 50 is divided into strata. From the top stratum to the bottom stratum, fluids change from a somewhat clear fluid to a completely opaque fluid. The fluids in respective strata are collected by way of the corresponding valves 61 to 64.

For instance, the somewhat clear water having a relatively low object of removal content is collected by way of a filtration unit 66 by means of opening the second valve 61. Subsequently, the valves and 63 are sequentially opened, thereby collecting fluids of respective strata. Finally, a concentrated slurry accumulated on the bottom of the raw-water tank is collected by opening the valve 64.

If the valve 64 is opened first, the concentrated slurry flows out under the weight of raw water, and flow of fluids of upper strata also follows the concentrated slurry, thus rendering difficult the control of outflow of the fluids. For this reason, the fluids are collected by sequentially opening the valves 61, 62, 63, and 64.

Raw-water level check means 80 for checking the level of raw water in the raw water tank 50 is illustrated at the lower center portion of FIG. 13 (circled by a dotted line). Further, an L-shaped pipe 81 is attached to the side surface of the raw-water tank 50. Further, in accordance with the level of raw water, at least one pipe 82 is connected to the L-shaped pipe 81. The outer diameter of the pipe 82 matches the inner diameter of the pipe 81, and the pipe 82 is fitted into the pipe 81.

In a case where the level of raw water reaches a location slightly higher than the position where the valve 63 is attached, the pipe 82 is attached to the L-shaped pipe 81. So long as sight glass is provided in the upper portion of the pipe 82, the operator can ascertain the level of raw water. Accordingly, the operator can eliminate the raw water to a level very close to a concentrated slurry line while observing the level of raw water by way of the sight glass.

Further, so long as the pipe 81 is made of transparent material, such as glass, the operator can ascertain the level of raw water without involvement of attaching a sight glass to the pipe 81. Further, the raw-water level check means 80 may be attached to the raw-water tank 50 beforehand.

Means for extracting fluids to a level very close to a concentrated slurry is illustrated in the lower left portion of FIG. 13. As shown in the drawing, the L-shaped pipe 81 is attached to the inside of the raw-water tank 50 beforehand. If the object of removal content is specified in terms of a predetermined period of time or the amount of concentrated slurry is determined in terms of a predetermined period of time, the height of the pipe 81 is determined beforehand. So long as the top of the pipe 81 or 82 is located at a position slightly higher than the upper layer of concentrated slurry, raw water can be automatically drawn to the filtration unit 66 until the level of raw water reaches the position. Even if the valve 63 is erroneously left open, the outflow of raw water can be stopped at the position where the top of the pipe 81 or 82 is located. In the event that the level of concentrated slurry is raised or lowered, the level to which raw water is extracted can be controlled by removal of the pipe 82. As a matter of course, several pipes 82 may be attached to the pipe 81 at respective levels.

Although the coagulating sedimentation method of collecting concentrated wastewater has been described, the present invention is not limited to this method. For instance, if the concentration of the raw water 52 has reached a certain level, the raw water 52 may be transported to another filtration unit 66 (FD). For example, a slurry containing abrasive grains of 0.1 μm and a chemical are used in a CMP operation. Water is caused to flow during a polishing operation, and wastewater of a concentration lower than that of the slurry is drawn. As the thus-discharged raw water is filtrated, the raw water increases in concentration and becomes viscous. If the filtration units are spaced at narrow intervals, air bubbles encounter difficulty in entering the filtration units and fail to impart external force to solid substances and objects of removal. If objects of removal are very minute, as denoted in FIG. 14B, the filtration units are quickly deteriorated in filtration capability. As a measure to prevent such deterioration in filtration capability, when the concentration of raw water has achieved a predetermined level, the raw water is preferably transported to another filtration unit FD. For instance, as shown in the lower right portion of FIG. 13, there may be employed a filtration unit in which raw water is caused to flow into an upper portion of the filter FT and the raw water is suctioned by means of a vacuum by way of a pump P. Further, the filtration unit FD may be attached to a concentrated slurry recovery pipe, to thereby collect a concentrated slurry.

The raw water is filtrated through the filter FT and suctioned until the high-concentration raw water accumulates to a certain extent. The level of raw water stored in the raw-water tank 50 is lowered by transportation of raw water to the filtration unit FD, and low-concentration raw water is supplied from the pipe 51. As a result, the concentration of raw water stored in the raw-water tank 50 is lowered. When raw water is supplied until the filter FT is completely immersed in raw water, filtration is resumed, so that the viscosity of raw water is lowered, and air bubbles enter the spaces between the filtration units, thus exerting external force to solid substances.

The filtration units FD and 66 may be used as units for collecting objects of removal. If the content of objects of removal stored in the raw-water tank 50 has reached a predetermined level, the objects of removal may be separated from raw water through the filtration unit 66 (or FD) without involvement of coagulation and sedimentation. For example, in a case where silicon waste is filtrated, silicon waste separated from wastewater does not react with a chemical used for coagulation and sedimentation. Therefore, silicon waste is of comparatively high purity and may be re-melt into a silicon ingot for use as a wafer. Alternatively, silicon waste may be recycled in various fields in the form of, for example material for roofing tile, cement, or concrete.

As mentioned previously, the filtration system shown in FIG. 13 is made up of the raw-water tank 50, the filtration unit (which is of suction type and is to be immersed in raw water) 53, and a small-sized pump 57. In order to prevent the first filter from being clogged, low-pressure suction is applied to the filter. Hence, the filtration system has the merit of employing the small-size pump 57. Further, in an existing filtration system, raw water passes through a pump, so that the interior of the pump is worn out by the raw water, thus greatly shortening the life of the pump. In contrast, in the filtration system of the present invention, a filtrated fluid flows through the pump 57, thus greatly prolonging the life of the pump. Accordingly, the filtration system can be made of smaller scale, and the electricity consumed by the pump 57 can be conserved. Further, an expense incurred by replacing a pump with a new one is significantly reduced, thus diminishing both initial cost and running cost.

The filter film is made of polyolefine-based material and has a mechanical strength sufficient to withstand falling. Further, the filter film has high resistance to a chemical such as an acid or alkaline. Therefore, the filter film can cope with high-concentration raw water, and raw water can be coagulated and precipitated while the filter film is attached to the filtration unit.

Further, raw water is coagulated and precipitated not in another tank but in the raw-water tank, thereby obviating a necessity for additional pipes or pumps. Thus, the present invention enables realization of a filtration system which conserves resources.

The filtration unit performs a filtration operation at a low flow rate and low pressure by means of suction. Further, as a result of formation of a second filter film over the first filter film, solid substances and objects of removal can be prevented from entering pores of the first filter film, thus improving the filtration performance of the filtration unit. Further, by virtue of external force generation means, such as an air-bubble generator, continuous filtration operation is feasible. A rate of filtration and filtration pressure are set to fall within a range in which the first filter film and the second filter film are prevented from being crumbled or deflected. In practice, the rate of filtration is set to fall within a range from 0.01 to 5 meter/day, and filtration pressure is set to fall within a range from 0.01 to 1.03 kgf/cm$^2$ (1 Torr).

Since adhesion of solid substances and objects of removal to the inside of the filter film can be prevented, a necessity for back washing, which would be required by an existing filter, is substantially obviated.

Although the present invention has been described by reference to silicon waste which acts as solid substances and originates from a silicon wafer and abrasive grains and abrasion waste (or grinding waste) generated as objects of removal during a CMP operation, the present invention can be applied in various fields.

Solid substances having a grain size distribution such as that shown in FIG. 2A may be formed from a material other than that of the object of removal. For instance, a second filter film may be formed from an inorganic substance, such as alumina, zeolite, diatomaceous earth, ceramic, or metal, so as to assume a grain size distribution such as that shown in FIG. 2A. Although the grain size distribution shown in FIG. 2A shows two peaks, filtration of any solid substances is possible in principle, so long as solid substances of large grain size and solid substances of small grain size are distributed over a range from several to 500 μm. No problem arises even if solid substances consist of different materials. Further, so long as objects of removal are essentially solid substances, all objects of removal can be filtrated.

Wastewater has imparted harm of many types to the global environment, and adoption of the present invention applicable to various fields would contribute to a significant reduction in the harm.

Since the present invention can be adopted for unlimitedly eliminating waste containing toxic substances from large-size waste to small-size waste, the present invention can be applied to a refuse incinerating plant involving generation of toxic substances containing dioxin, an uranium refinery for refining radioactive materials, and a plant involving generation of fine particles containing toxic substances.

The present invention can eliminate objects of removal corresponding to inorganic solid substances containing at least one of group IIA elements to group VIIA elements and group IIB elements to group VIIB elements in the periodic table.

Recovery of objects of removal will now be described by reference to FIG. 15.

Objects of removal (for example, those contained in wastewater discharged during a CMP operation) are caused to flow into the raw-water tank 50 by way of the pipe 51, and a filtration operation is commenced. The object content of a filtrated fluid is checked. If the object content is higher than a desired level, the raw water is circulated. In contrast, if the object content is at or lower than the desired level, a filtration operation is commenced. At the time of initiation of a filtration operation, a change is made from the pipe 59 to the pipe 60 by means of the first valve 58. The air-bubble generator 54 may be started from this time at the earliest. Reference numeral 70 designates a pressure meter for detecting the pressure of a filtrated fluid which passes through the pipe 56, and reference numeral 71 designates a flow meter.

A filtration operation is continued. If the concentration of wastewater stored in the raw-water tank 50 exceeds a predetermined level, any one of the valves 61 to 64 is opened, thereby causing the raw water 52 to flow into the filtration unit FD. Several tens of filtration units 53 are disposed parallel to one another within the raw-water tank 50. If the viscosity of the raw water 52 is increased, air bubbles encounter difficulty in entering the spaces between the filtration units 53, thus hindering flow of air bubbles over the surface of the filter films of the filtration units 53. If the concentration of wastewater exceeds a predetermined level, at least a portion of the wastewater is transported to the filtration unit FD in order to reduce the concentration of the wastewater, and the concentration of the wastewater is lowered by the wastewater supplied by way of the pipe 51.

The filtration unit FD is divided into a first bath 72 and a second bath 73. A filter FT whose pores are coarser than those of the first filter film is interposed between the two baths 71 and 73. Suction is applied to the pipe 74 by way of a pump, thereby forcefully transporting raw water to the second bath 73.

A sediment 75 which is a mass of objects of removal is accumulated on the filter FT through filtration in the filtration unit FT, and the sediment 75 is collected through use of a container 76. Since the sediment 75 flies in all directions while in a dry state, the container is preferably sealed.

As recovery of objects of removal is continued, the level of the raw-water tank 50 is lowered. In this case, the fluid filtered through the filtration unit FD is returned to the raw-water tank 50. Since wastewater is supplied to the raw-water tank 50 by way of the pipe 51, the concentration of raw water stored in the raw-water tank 50 is lowered, and a filtration operation can be commenced. The timing at which the pump is stopped in accordance with the level of wastewater and at which a filtration operation is commenced is determined by a level sensor FS.

Figure 16:
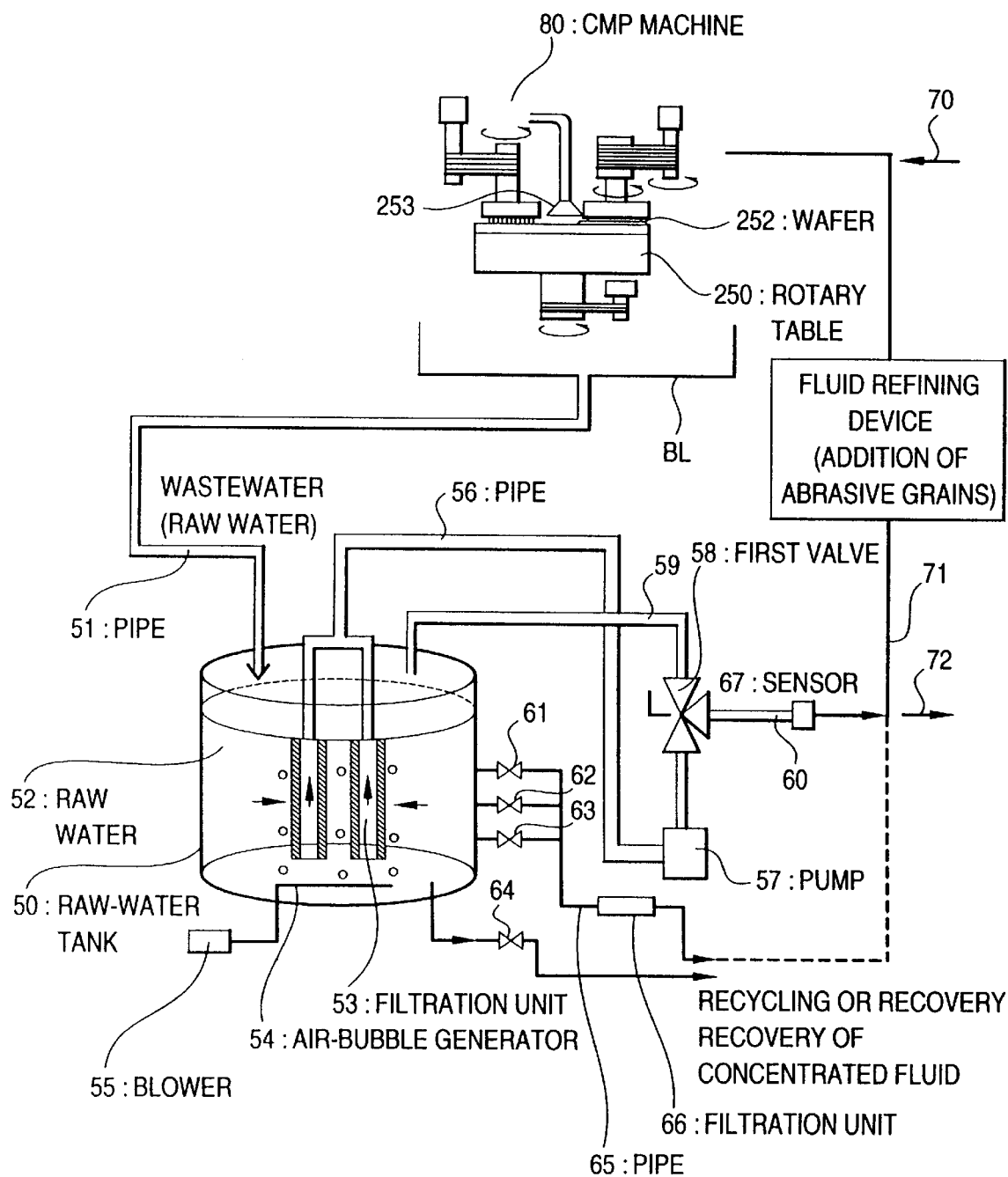
FIG. 16 is an illustration of a system for describing a filtration method according to the present invention.

A method of recycling a filtrated fluid—which is produced by elimination of abrasive grains and abrasion waste (grinding waste) from wastewater discharged during a CMP operation—will now be described by reference to FIG. 16.

Figure 19:
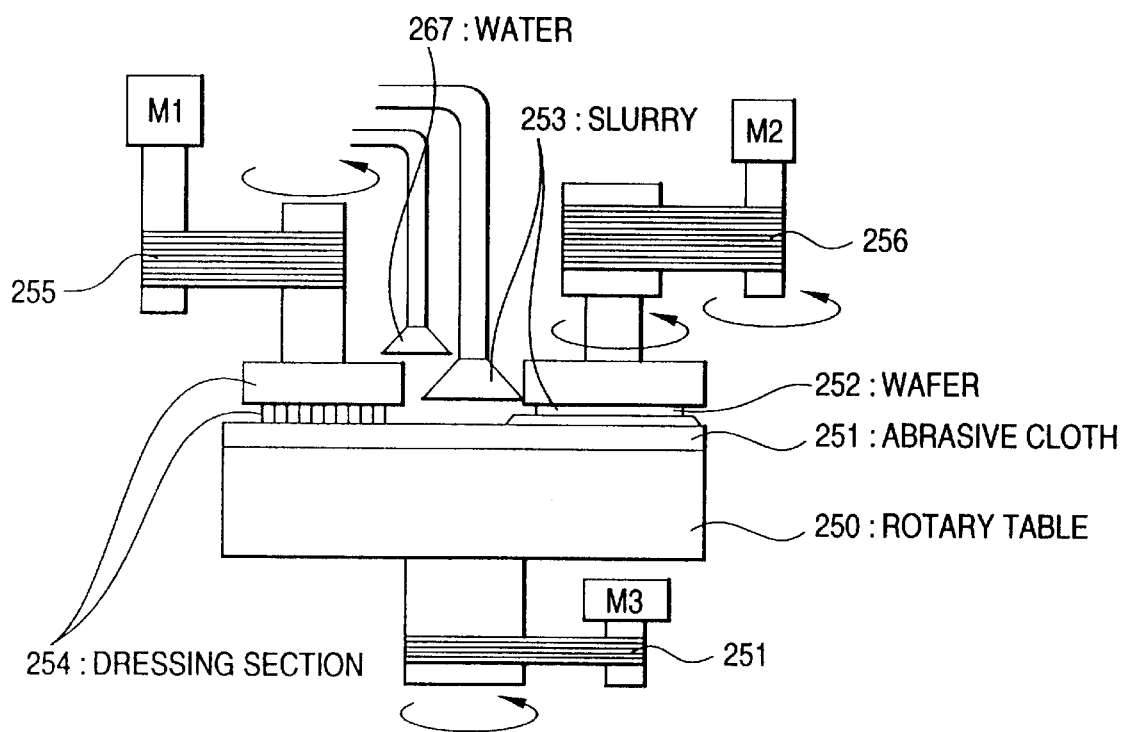
FIG. 19 is an illustration for describing the CMP machine.

A CMP machine designated by reference numeral 80 is usually disposed in the form of a system. For convenience of explanation, the CMP machine 80 corresponds to the CMP machine shown in FIG. 19. In other respects, the filtration system exclusive of the CMP machine 80 is identical with that shown in FIGS. 13 and 15.

Reference numeral 252 designates a semiconductor wafer placed on a rotary table 250; and 253 designates a slurry. Although not shown in the drawings, a shower for applying pure water to the wafer 252 and the rotary table 250 is also provided around the CMP machine 80.

Figure 20:
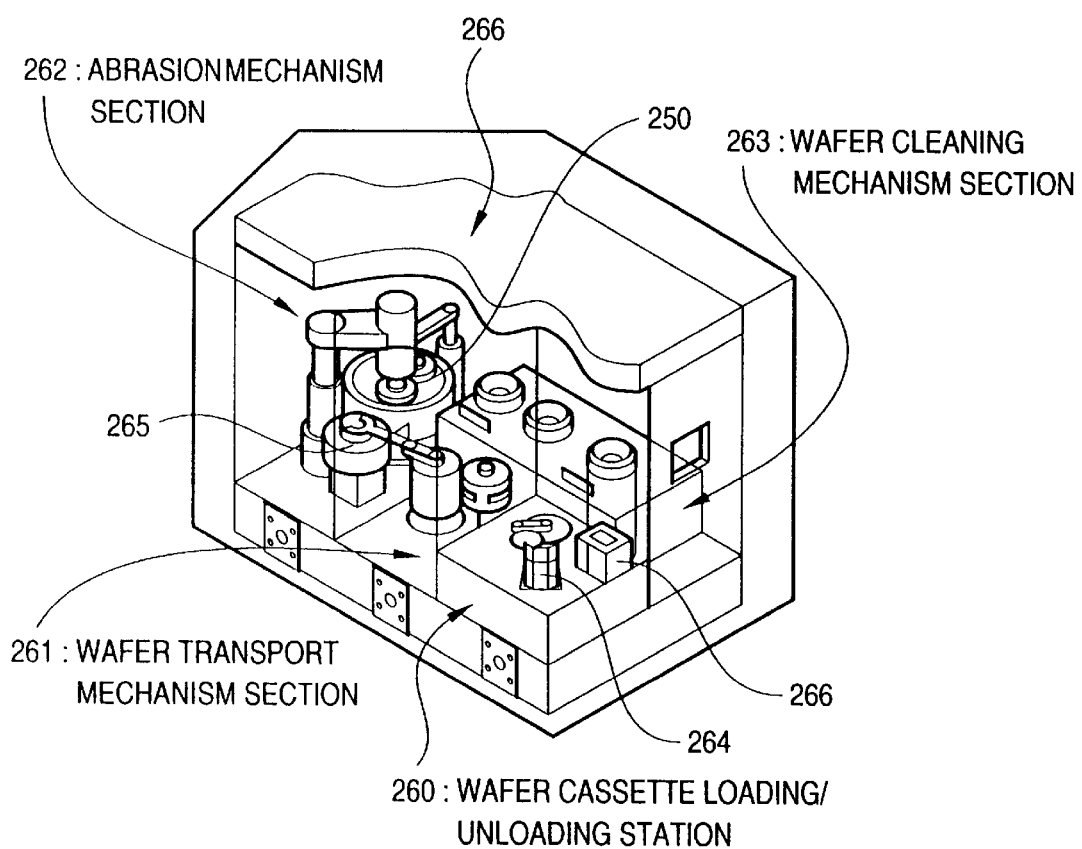
FIG. 20 is an illustration for describing the CMP machine.

A vessel BL for receiving wastewater is provided below the CMP machine 80; i.e., a wafer cleaning mechanism section. The pipe 51 connected to the raw-water tank 50 is attached to a portion of the vessel BL. Since the arrangement of the pipe has already been described in detail in connection with FIGS. 19 and 20, repetition of its explanation is omitted here.

Wastewater comprises a mixture of a stock solution of slurry (primarily containing a diluent, a pH controller, and abrasive grains), granular abrasion or grinding waste, ions of a substance constituting a semiconductor wafer, and water. Most of the abrasive grains and abrasion waste (or grinding waste) mixed in the slurry are substantially entrapped by the filtration units 53. The fluid which passes through the pipe 60 contains the stock solution of slurry from which abrasive grains are eliminated (for example, a mixture of KOH or $NH_3$, serving as a controller, and a diluent), water, and ions. So long as a purifier for removing water and ions is disposed at any location in a pipe 71, the filtrated fluid can be recycled. Abrasive grains are again mixed into the refined stock solution of slurry and the resultant mixture is agitated. The resultant fluid can be recycled as a slurry for use with a CMP machine.

The filtrated fluid is transported to another tank by way of a pipe 72 and may be handed over to a refining company for refining. By means of such a filtration system, a large quantity of wastewater discharged during a CMP operation can be recycled.

Figure 17:
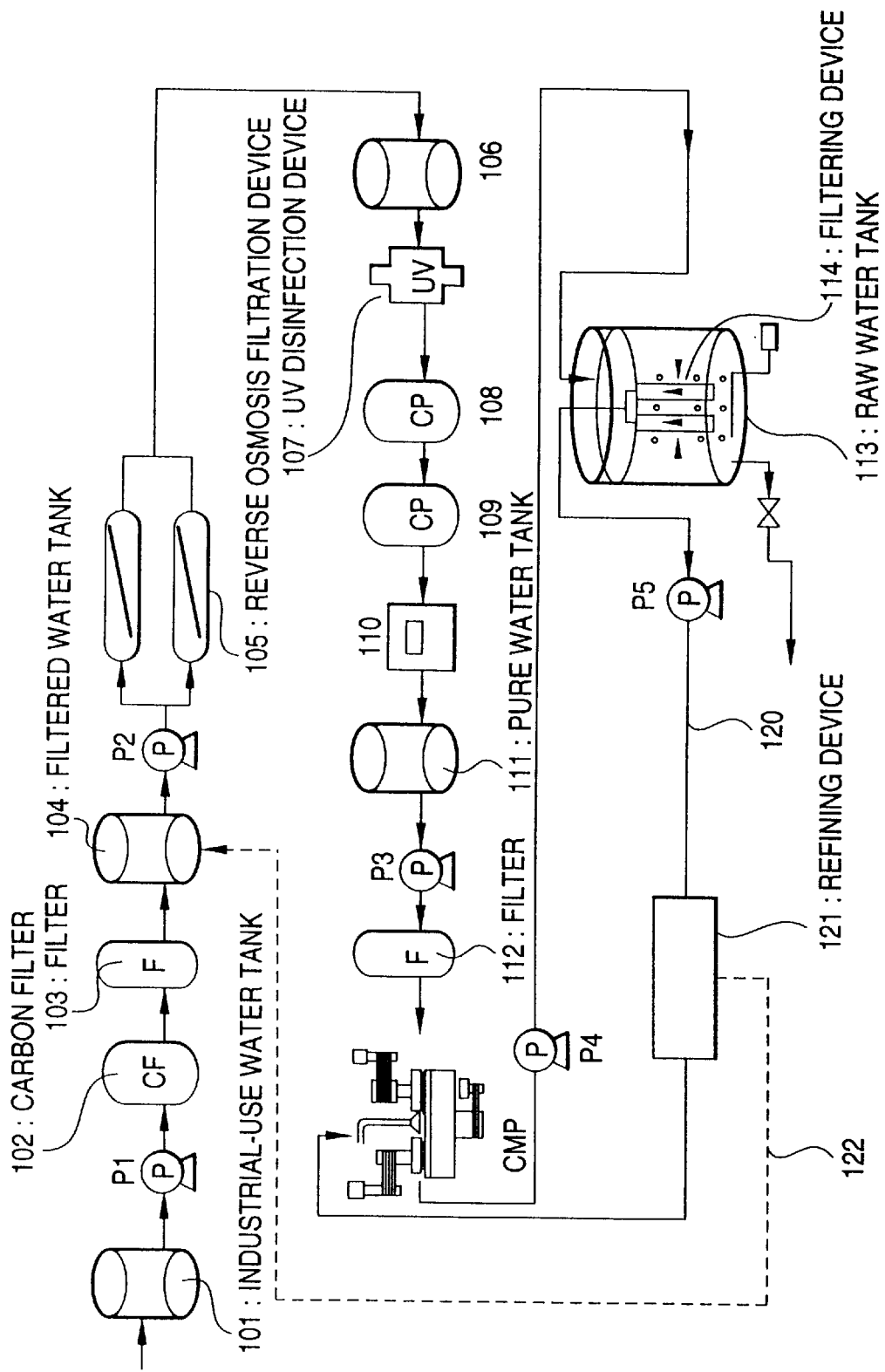
FIG. 17 is an illustration of a system in which the filtration method of the present invention is applied to a chemical-and-mechanical polishing (CMP) machine.
Figure 18:
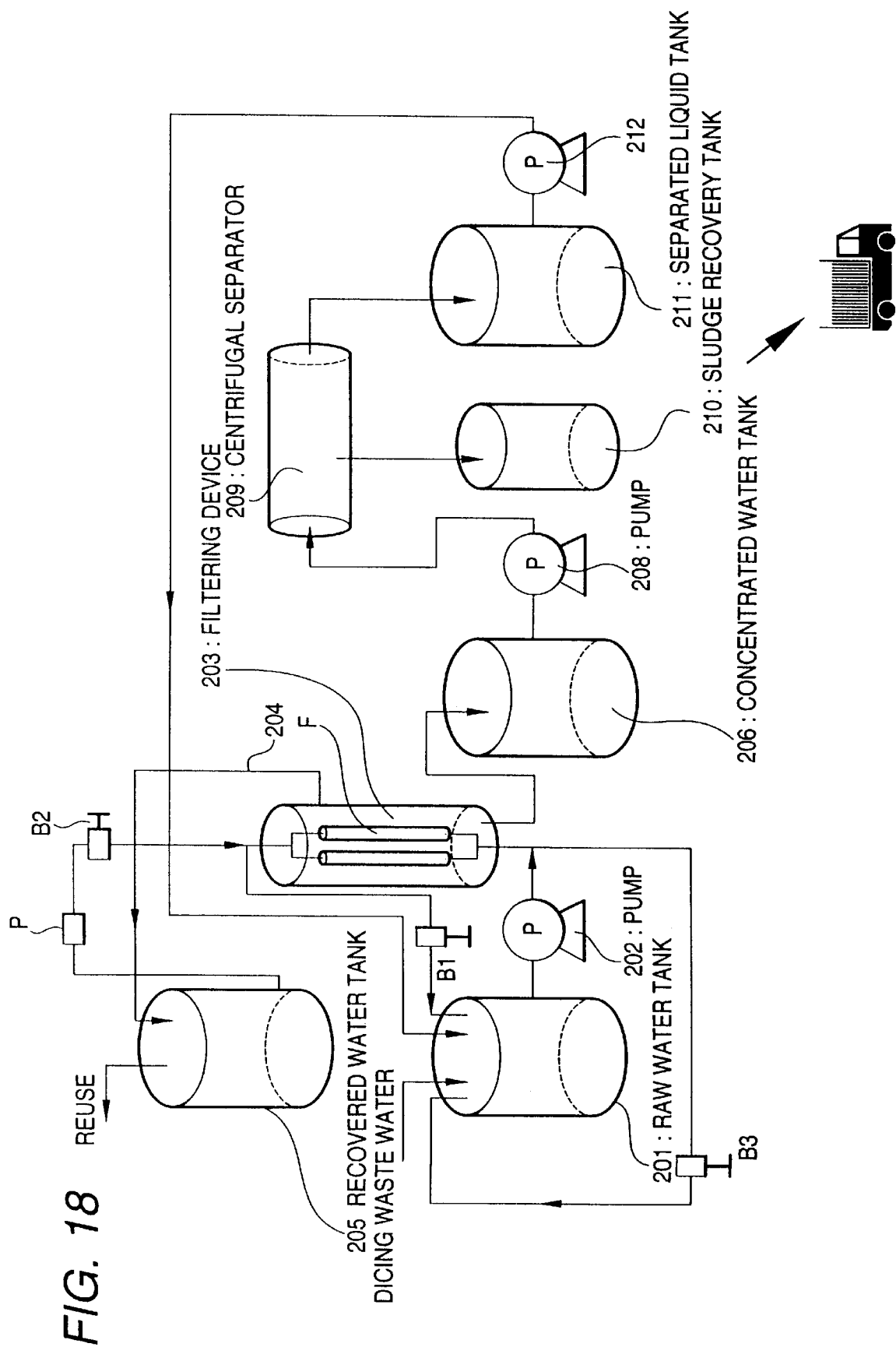
FIG. 18 is an illustration for describing a known filtration system.

The relationship between a real pure water manufacturing system and a filtration system will now be described by reference to FIG. 17.

Industrial water is reserved in an industrial-water tank 101. The industrial water is transported through a pump P1 to a filtrated-water tank 104 by way of filters 102 and 103. The filter 102 is a carbon filter for eliminating dust or organic substances, and the filter 103 is for eliminating carbon originating from the carbon filter 102.

The filtrated fluid is transported to a pure-water tank 106 by way of reverse osmosis filtration units 105. The filtration units 105 use a reverse osmosis film and eliminates waste (or dust) of 0.1 $\mu$m or less. The pure water is transported from the pure-water tank 106 to a pure-water tank 111 by way of an UV pasteurization device 107, absorption devices 108 and 109, and a device 110 for lowering the resistance of pure water.

As can be inferred from its name, the UV pasteurization device 107 pasteurizes pure water by use of UV rays, and the absorption devices 108 and 109 perform ionic exchange, to thereby eliminate ions. The device 110 is to mix a carbonic acid gas into pure water. In the event that pure water has a high resistance value, electric charges develop in blades. In order to prevent accumulation of electric charges, the resistance of pure water is deliberately reduced.

By way of a pump P3, pure water is supplied as wash water for cleaning a CMP machine. Reference numeral 112 designates a filter for again removing waste (dust) of about 0.22 $\mu$m or more.

Wastewater generated in the CMP machine is stored in a raw-water tank 113 by way of a pump P4 and is filtrated by filtration units 114. The filtration units 114 are the same as the filtration units described in connection with FIGS. 9 and 10. The fluid filtrated through the filtration units 114 is refined by a refining device 121 connected to a pipe 120. The water separated through filtration is returned to the filtrated water tank 104. Abrasive grains are mixed into the fluid filtrated through the refining device 121, and the fluid may be recycled as a slurry for use with a CMP machine.

Needless to say, in a case where objects of removal are mixed into the filtrated fluid in the filtration units 114, the fluid is returned to and circulated in the raw-water tank 113.

In order to eliminate particles of approximately 0.1-$\mu$m, such as abrasive grains to be mixed into a CMP slurry, a filter film having pores smaller than the particles is commonly employed. In the present invention, solid substances which are the same size as or larger than objects of removal are stacked in the form of a second filter film, and numerous apertures formed in the second filter film are utilized as flow channels for a fluid. Therefore, a fluid containing particles of approximately of 0.1 $\mu$m can be eliminated by immersing into wastewater only a filtration unit having a second filter film. A filtration system can be established by use of a filtration unit having a second filter film formed thereon, pumps, and tanks. Thus, the present invention can embody a high-performance filtration system which requires lower construction cost and running cost.

The second filter film is a mass of solid substances, and hence objects of removal and solid substances, which would cause clogging, can be separated from the second filter film, thereby sustaining the filtration capability of the filtration unit for a long period of time. Further, objects of removal and/or solid substances contained in wastewater are accumulated into a second filter film through circulation, thus enabling formation of a second filter film having the filtration ability to entrap grains of certain size. The second filter film can be repaired by itself. Accordingly, there can be embodied a filtration system which involves much less maintenance than that does an existing filtration system.

What is claimed is:

1. A method of filtering a fluid, comprising:
   preparing a filter comprising a base filter and releasable solid substances provided on the base filter, said solid substances differing from objects of filtration in the fluid;
   filtering the objects of filtration by supplying the fluid to the filter; and
   applying a force to the filter to move the solid substances and objects deposited on the filter while continuing to filter the objects.

2. The method of filtering a fluid according to claim 1, wherein preparing a filter comprises forming a secondary filter on the base filter by depositing the solid substances on the base filter.

3. A method of filtering a object in a fluid according to claim 2, wherein said force to the filter releases at least part of the secondary filter.

4. A method of filtering a object in a fluid according to claim 2, wherein said applying a force to the filter comprises controlling a thickness of the secondary filter.

5. A method of filtering an object in a fluid according to claim 2, wherein said secondary filter comprises at least on element selected from the group consisting of Si, SiGe, $Al_2O_3$, Si oxide, metal oxide, and the IIa–VIIa, and IIb–VIIb group of elements.

6. A method of filtering an object in a fluid according to claim 2, wherein said secondary filter comprises Si.

7. A method of filtering an object in a fluid according to claim 6, wherein said secondary filter comprises flake type of Si.

8. A method of filtering an object in a fluid according to claim 7, wherein said mechanical processing waste is a dicing waste.

9. A method of filtering an object in a fluid according to claim 2, wherein said secondary filter comprises a mechanically processed waste generated in a mechanical processing step.

10. A method of filtering an object in a fluid according to claim 9, wherein said mechanical processing step comprises polishing or grinding.

11. The method of filtering a fluid according to claim 1, wherein a particle distribution size of the solid substances is greater than a particle distribution size of the objects in the fluid.

12. The method of filtering a fluid according to claim 1, wherein preparing a filter comprises:
   mixing solid substances to the fluid comprising objects of filtration; and
   passing the fluid through the base filter to deposit the solid substances thereon as a secondary filter.

13. The method of filtering a fluid according to claim 1, wherein preparing a filter comprises:
   mixing in the fluid, solid substances whose diameter is larger than a diameter of objects of filtration in the fluid, and
   passing the fluid through the base filter to deposit the solid substances thereon as a secondary filter.

14. The method of filtering a fluid according to claim 1, wherein preparing a filter comprises:
   providing solid substances whose composition is different from a composition of the objects of filtration.

15. The method of filtering a fluid according to claim 1, wherein preparing a filter comprises:
   mixing in the fluid, solid substances whose composition is different from a composition of the objects of filtration in the fluid; and
   passing the fluid through the base filter to deposit the solid substances thereon as a secondary filter.

16. The method of filtering a fluid according to claim 1, wherein preparing a filter comprises:
   forming a secondary filter by immersing the base filter into a fluid containing solid substances different from the objects of filtration.

17. The method of filtering a fluid according to claim 1, wherein the fluid is acidic or alkaline, and a neutralizer is mixed into the fluid, thus neutralizing the fluid.

18. The method of filtering a fluid according to claim 1, wherein preparing a filter comprises circulating the fluid comprising objects of filtration through the base filter.

19. The method of filtering a fluid according to claim 1, wherein the filter comprises solid substances of different sizes or objects of filtration of different sizes.

20. The method of filtering a fluid according to claim 1, wherein the solid substances or the objects of filtration comprise particles of different sizes, and pores of the base filter are greater in size than a smallest object and smaller in size than a largest object.

21. The method of filtering a fluid according to claim 1, wherein the solid substances or the objects of filtration comprise flake particles, and pores of the base filter are greater in size than a smallest flake particle and smaller in size than a largest flake particle.

22. The method of filtering a fluid according to claim 1, wherein a diameter of the smallest solid substance or objects of filtration is less than 0.25 $\mu$m.

23. The method of filtering a fluid according to claim 1, wherein the size of distribution of the solid substances shows two peaks, and the pore size of the base filter falls with the range between the two peaks.

24. The method of filtering a fluid according to claim 1, wherein solid substances or objects of filtration that are greater in size than the pores of the base filter are present in greater proportion than solid substances or objects of filtration that are smaller in size than the pores of the base filter.

25. The method of filtering a fluid according to claim 1, wherein said filtering objects of filtration comprises circulating the fluid for a preset time.

26. A method of filtering an object in fluid according to claim 25, wherein said circulation the fluid comprises:
   detecting a concentration of the solid substances in the fluid passing through the filter; and
   stopping circulation when a detected inclusion degree of the fluid passing through the filter has fallen below a preset value.

27. A method of filtering an object in a fluid according to claim 26, wherein said detecting an inclusion degree comprises detecting a transparence of the fluid by a light sensor.

28. A method of filtering an object in a fluid according to claim 25, wherein said circulating the fluid comprises detecting an inclusion degree of the fluid passing through the filter; and starting circulation of the fluid when the detected degree exceeds a preset value.

29. A method of filtering an object in a fluid according to claim 1, wherein said filtering objects filtration comprises filtering the fluid while sucking through the filter.

30. A method of filtering an object in a fluid according to claim 29, wherein an applied suction pressure in sucking the fluid through the filter is within a range of 0.2 to 0.5 kg/cm$^2$.

31. A method of filtering a object in a fluid according to claim 1, wherein said force to the filter is applied intermittently.

32. A method of filtering a object in a fluid according to claim 1, wherein said force to the filter is a gas flow along a surface of the base filter.

33. A method of filtering a object in a fluid according to claim 1, wherein said filter is disposed in a vertical direction and said force comprises rising bubbles.

34. A method of filtering a object in a fluid according to claim 1, wherein said force comprises a mechanical vibration.

35. A method of filtering a object in a fluid according to claim 1, wherein said force comprises a sonic wave.

36. A method of filtering a object in a fluid according to claim 1, wherein said force comprises a flow of the filter.

37. A method of filtering a object in a fluid according to claim 1, wherein said base filter is made of polyolefin high polymer.

38. A method of filtering a object in a fluid according to claim 1 wherein said base filter has an uneven surface.

39. A method of filtering a object in a fluid according to claim 1, wherein said base filter is a bag filter with a pipe for sucking inserted therein.

40. A method of filtering an object in a fluid according to claim 1 wherein said preparing a filter comprises adding a flake shaped waste into the fluid.

41. A method of filtering an object in a fluid according to claim 1, wherein said fluid comprises fine particles produced in a mechanical processing step.

42. A method of filtering an object in a fluid according to claim 1, wherein said fluid comprises fine particles produced in a CMP step.

43. A method of filtering a fluid, comprising:

providing a base filter into a tank;

supplying a fluid comprising objects of filtration and solid substances into the tank;

passing the fluid through the base filter to deposit the solid substances thereon as a secondary filter and to filter the objects of filtration; and applying a force to the secondary filter to move the solid substances and any objects deposited on the base filter while continuing to filter the objects of filtration.

44. A method of filtering a fluid comprising liquid and removable objects, said method comprising:

preparing a filter assembly comprising a first filter film and a releasable second filter film by forming said second filter film on said first filter film, said second filter film comprising solid particles differing from said removable objects;

placing said filter assembly with the outer surface of said second film disposed substantially vertically;

operating said filter assembly by passing at least part of said liquid component through said first and second filter films, thereby removing at least some of said objects from said fluid; and applying rising gas bubbles to said second film while continuing to filter and fluid by operating the filter assembly.

45. A method of filtering a fluid according to claim 44, further comprising:

applying the bubbles intermittently to the surface of the filter while filtering the removable objects, thereby refreshing the filter.

46. A method of filtering a fluid according to claim 44, wherein said gas bubbles are applied directly on constituents of the second filter film.

47. A method of filtering a fluid according to claim 44, wherein the first filter film is divided into a plurality of members enclosing a space.

48. A method of filtering a fluid, comprising:

preparing a filter comprising a base filter and releasable solid substances provided on the base filter, said solid substances differing from objects of filtration in the fluid;

faltering the objects of filtration by supplying the fluid to the filter; and refreshing the filter to allow continuous filtration by moving the solid substances and objects deposited on the filter.

* * * * *